US010559375B2

(12) United States Patent
Shim

(10) Patent No.: US 10,559,375 B2
(45) Date of Patent: Feb. 11, 2020

(54) SEMICONDUCTOR DEVICE AND OPERATING METHOD THEREOF

(71) Applicant: SK hynix Inc., Gyeonggi-do (KR)

(72) Inventor: Young-Bo Shim, Chungcheongnam-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 15/971,591

(22) Filed: May 4, 2018

(65) Prior Publication Data
US 2019/0108893 A1 Apr. 11, 2019

(30) Foreign Application Priority Data
Oct. 11, 2017 (KR) .......................... 10-2017-0129848

(51) Int. Cl.
G11C 17/16 (2006.01)
G11C 29/44 (2006.01)
G11C 17/18 (2006.01)
G11C 29/02 (2006.01)
G11C 29/12 (2006.01)
G11C 29/04 (2006.01)

(52) U.S. Cl.
CPC .......... *G11C 29/4401* (2013.01); *G11C 17/16* (2013.01); *G11C 17/18* (2013.01); *G11C 29/027* (2013.01); *G11C 2029/0407* (2013.01); *G11C 2029/1202* (2013.01); *G11C 2029/1204* (2013.01)

(58) Field of Classification Search
CPC ..... G11C 29/4401; G11C 17/16; G11C 17/18; G11C 29/027; G11C 29/76; G11C 2029/0407; G11C 2029/1202; G11C 2029/1204

USPC ....................................... 365/189.011–225.7
See application file for complete search history.

(56) References Cited

U.S. PATENT DOCUMENTS

| 6,667,918 | B2 * | 12/2003 | Leader | G11C 29/72 365/201 |
| 7,187,603 | B2 * | 3/2007 | Nagata | G11C 29/44 365/200 |
| 8,363,502 | B2 | 1/2013 | Rey-Losada | |
| 2003/0206470 | A1 * | 11/2003 | Leader | G11C 29/72 365/201 |
| 2004/0208070 | A1 * | 10/2004 | Nagata | G11C 29/44 365/201 |

(Continued)

FOREIGN PATENT DOCUMENTS

KR 1020160001499 1/2016

*Primary Examiner* — Harry W Byrne
(74) *Attorney, Agent, or Firm* — IP & T Group LLP

(57) ABSTRACT

A semiconductor device includes: a non-volatile memory including a normal region, a self-repair region and a redundancy region, each having a plurality of cells; a first boot-up control block suitable for controlling a first boot-up operation to detect defective cells of the normal region and store a defective address in a first latch unit; a self-program control block suitable for controlling a self-program operation to program the defective address stored in the first latch unit into the self-repair region; and a second boot-up control block suitable for controlling a second boot-up operation to read out data of the normal region based on an input address while reading out data of the redundancy region instead of the data of the normal region when data of the self-repair region coincides with the input address.

10 Claims, 18 Drawing Sheets

(56) References Cited

U.S. PATENT DOCUMENTS

2016/0125959 A1\* 5/2016 Otterstedt ........ G11C 29/50016
   365/201

\* cited by examiner

SEMICONDUCTOR DEVICE AND OPERATING METHOD THEREOF

CROSS-REFERENCE TO RELATED APPLICATIONS

This application claims priority under 35 U.S.C. § 119 to Korean Patent Application No. 10-2017-0129848, filed on Oct. 11, 2017, the disclosure of which is incorporated herein by reference in its entirety.

BACKGROUND

1. Field

Various exemplary embodiments of the present invention relate to a semiconductor design technique, and more particularly, to a semiconductor device that transmits data from a non-volatile memory to a latch circuit, and an operating method for the semiconductor device.

2. Description of the Related Art

A semiconductor integrated circuit is provided with a redundancy circuit to repair a defective circuit included therein.

In particular, when integrating a large number of memory cells in a single chip of a limited size in accordance with the high integration of a semiconductor integrated circuit, a non-volatile memory for storing information of a defective memory cell and redundancy cells for replacing the defective memory cell during a repair operation may be provided.

Recently, a method of programming repair information not only at a wafer level but also at a package level has been proposed by using an array E-fuse (ARE) circuit, in which unit fuse cells are arranged in an array and implemented by nonvolatile memory cells.

In order to use fuse data stored in the ARE circuit, a boot-up operation is required for providing the fuse data from the ARE circuit to a latch circuit. In general, E-fuses in the ARE circuit respectively correspond with unit latches of the latch circuit thereby respectively providing the fuse data of the E-fuses to the unit latches during the boot-up operation.

After the boot-up operation, the semiconductor device may perform the repair operation by using the fuse data stored in the latch circuit.

Furthermore, because of high density integration of a semiconductor memory device due to an increase in cell density and a reduction in an occupying area, a yield of the semiconductor memory device becomes more and more difficult to be secured. In order to solve this problem, the number of redundancy cells is increased. However, the increase of the number of redundancy cells leads to the high density integration of the ARE circuit, which causes an increase of failures due to process defects.

Even though a defect occurs in an ARE circuit, there is no scheme of repairing the defect and it is difficult to find the location of the defect, which leads to a yield loss.

SUMMARY

Various embodiments of the present invention are directed to a semiconductor device capable of detecting defective fuse cells of a non-volatile memory and self-repairing the defective fuse cells during a boot-up operation, and an operating method for the semiconductor device.

In accordance with an embodiment of the present invention, a semiconductor device includes: a non-volatile memory including a normal region, a self-repair region and a redundancy region, each having a plurality of cells; a first boot-up control block suitable for controlling a first boot-up operation to detect defective cells of the normal region and store a defective address in a first latch unit; a self-program control block suitable for controlling a self-program operation to program the defective address stored in the first latch unit into the self-repair region; and a second boot-up control block suitable for controlling a second boot-up operation to read out data of the normal region based on an input address while reading out data of the redundancy region instead of the data of the normal region when data of the self-repair region coincides with the input address.

In accordance with an embodiment of the present invention, a semiconductor device includes: a non-volatile memory including a normal fuse region, a self-repair fuse region and a redundancy fuse region, each having a plurality of fuse cells; an operation control block suitable for reading out normal fuse data of the normal fuse region and programming an defective address, which is stored in a latch unit during a self-rupture operation, into the self-repair fuse region during a first boot-up operation, and for sequentially reading out self-fuse data of the self-repair fuse region and the normal fuse data of the normal fuse region while reading out redundancy fuse data of the redundancy fuse region instead of the normal fuse data based on an redundancy enable signal during a second boot-up operation; an error detection block suitable for detecting defective fuse cells of the normal fuse region based on the normal fuse data, which is read out during the first boot-up operation and storing the defective address in the latch block; and a comparison block suitable for comparing the self-fuse data, which is read out during the second boot-up operation, with an input address and activating the redundancy enable signal when the self-fuse data coincides with the input address as a result of the comparison.

In accordance with an embodiment of the present invention, an operating method for a semiconductor device includes: providing a non-volatile memory including a normal region, a self-repair region and a redundancy region, each having a plurality of cells; performing a first boot-up operation to detect defective cells of the normal region and store a defective address in a latch block; performing a self-program operation to program the defective address stored in the latch block into the self-repair region; and performing a second boot-up operation to sequentially read out data of the normal region based on an input address while outputting data of the redundancy region instead of the data of the normal region when data of the self-repair region coincides with the input address.

In accordance with an embodiment of the present invention, an operating method for a semiconductor device includes: a fuse unit including a fuse region, a redundancy fuse region and a defective information region; a defective fuse detection unit suitable for detecting a defective fuse portion in the fuse region, and storing a defective information into the defective information region according to the detection; and a repair unit suitable for storing a defective memory address into the fuse region except for the defective fuse portion for repair of a defective memory cell based on the defective memory address stored in the fuse unit, wherein the repair unit is further suitable for storing the defective memory address into a redundancy fuse portion in the redundancy fuse region instead of the defective fuse portion according to the defective information.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

Figure 1:
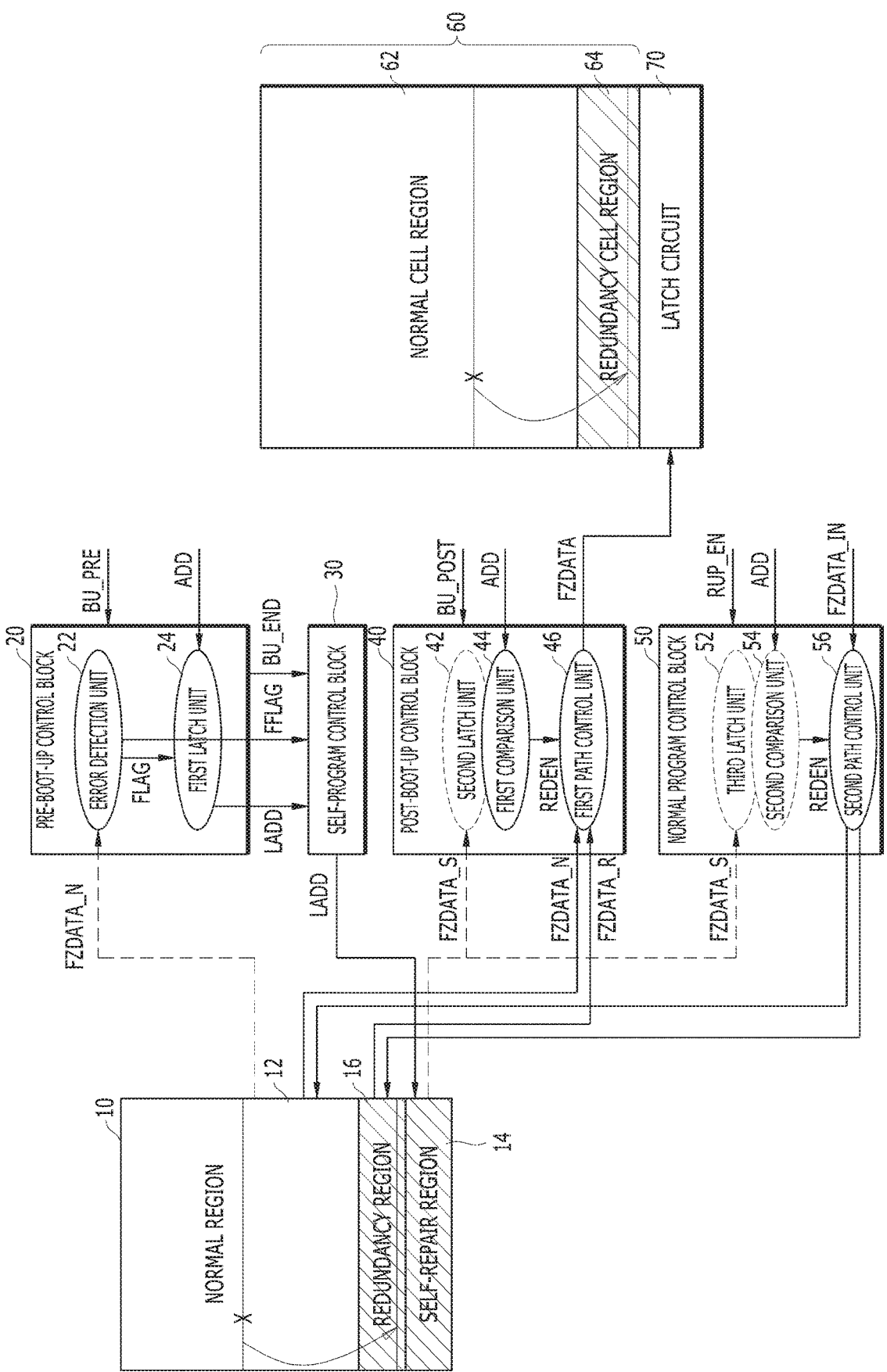
FIG. 1 is a block diagram illustrating a semiconductor device in accordance with an embodiment of the present invention.

FIG. 1 is a block diagram illustrating a semiconductor device in accordance with an embodiment of the present invention.

Referring to FIG. 1, the semiconductor device may include a non-volatile memory 10, a pre-boot-up control block 20, a self-program control block 30, and a post-boot-up control block 40.

The non-volatile memory 10 may be provided as an array E-fuse (ARE) circuit. The non-volatile memory 10 may be any one of a NAND flash memory, a NOR flash memory, an electrically programmable read only memory (EPROM), an electrically erasable and programmable ROM (EEPROM), a ferroelectric random access memory (FRAM), a magnetic random access memory (MRAM), etc.

For describing a basic concept of the present invention, a configuration for controlling the non-volatile memory 10 is omitted from descriptions of the semiconductor device shown in FIG. 1.

For example, the non-volatile memory 10 as the array E-fuse circuit may include a plurality of unit fuse cells (not illustrated) disposed at cross points of row lines and column lines, and although address signals, and row and column control signals are required to control the unit fuse cells, descriptions thereof are omitted herein.

When the semiconductor device shown in FIG. 1 is a memory device, the semiconductor device may further include as a data storage media, a memory array region 60 and a latch circuit 70. The memory array region 60 may include a normal cell region 62 for storing data and a redundancy cell region 64 for repairing defective cells of the normal cell region 62.

The non-volatile memory 10 as the array E-fuse circuit may include a normal region 12, a self-repair region 14, and a redundancy region 16, each having a plurality of unit cells.

The normal region 12 may permanently store information (e.g., address information) on the defective cells of the normal cell region 62 regardless of power-on/off, and may be composed to correspond one-to-one with the redundancy cell region 64 of the memory array region 60.

The self-repair region 14 may permanently store information (e.g., address information) on defective cells in the normal region 12.

The redundancy region 16 may be formed to replace the defective cells in the normal region 12, and may permanently store the defective address of the defective cells in the normal cell region 62 instead of the defective cells in the normal region 12.

The pre-boot-up control block 20 may detect the defective cells in the normal region 12 and control a pre-boot-up operation for storing the information on the detected defective cells, i.e., a defective address. The pre-boot-up operation may be performed in an initial state where the non-volatile memory 10 is not programmed.

The pre-boot-up control block 20 may include an error detection unit 22 and a first latch unit 24.

The error detection unit 22 may receive data FZDATA_N from the normal region 12 and generate an error flag signal FLAG when the defective cells are detected in the normal region 12. During the pre-boot-up operation, the data FZDATA_N from the normal region 12 have a predetermined initial value if a corresponding fuse cell is not defective in the normal region 12.

The first latch unit 24 may store as a defective address LADD an input address ADD, which is inputted when the error flag signal FLAG is generated.

The pre-boot-up control block 20 may perform the pre-boot-up operation based on a pre-boot-up signal BU_PRE, and may output a boot-up termination signal BU_END when the pre-boot-up operation is completed.

The pre-boot-up control block 20 may output a final flag signal FFLAG according to the generated error flag signal FLAG.

The self-program control block 30 may control a self-program operation for programming into the self-repair region 14 the defective address LADD, which corresponds to the defective fuse cell in the normal region 12 and is provided from the first latch unit 24.

The self-program operation may be performed in response to the final flag signal FFLAG and the boot-up termination signal BU_END. That is, when a defective fuse cell is detected during the pre-boot-up operation, the self-program control block 30 may voluntarily program into the self-repair region 14 the defective address LADD of the defective fuse cell during the self-program operation. The defective address LADD of the defective fuse cell may be provided as data FZDATA_S from the self-repair region 14 during the post-boot-up operation.

The post-boot-up control block 40 may read out the data FZDATA_N of the normal region 12 based on the input address ADD while comparing the input address ADD with the defective address LADD of the defective fuse cell provided as data FZDATA_S from the self-repair region 14. When the input address ADD coincides with the data FZDATA_S of the self-repair region 14, the post-boot-up control block 40 may control a post-boot-up operation for outputting data FZDATA_R of the redundancy region 16 instead of the data FZDATA_N of the normal region 12. The data FZDATA_R may be read out from a redundant fuse cell, with which the defective fuse cell of the defective address LADD is replaced, in the redundancy region 16.

The post-boot-up control block 40 may perform the post-boot-up operation in response to a post-boot-up signal BU_POST. The post-boot-up operation may be performed after the self-program operation.

The post-boot-up control block 40 may include a second latch unit 42, a first comparison unit 44, and a first path control unit 46.

The second latch unit 42 may store the defective address LADD, which represents the defective fuse cell of the normal region 10 and programmed as the data FZDATA_S into the self-repair region 14. The first latch unit 24 and the second latch unit 42 may be composed of the same latch circuit.

The first comparison unit 44 may compare the defective address LADD stored in the second latch unit 42 with the input address ADD, and may generate a redundancy enable signal REDEN when the defective address LADD coincides with the input address ADD.

The first path control unit 46 may sequentially read out the data FZDATA_N of the normal region 12. However, when the redundancy enable signal REDEN is generated, the first path control unit 46 may control outputting to the latch circuit 70 the data FZDATA_R of the redundancy region 16 instead of the data FZDATA_N of the normal region 12.

The latch circuit 70 may store data FZDATA, which is one of the data FZDATA_N of the normal region 12 and the data FZDATA_R of the redundancy region 16, outputted from the first path control unit 46.

The semiconductor device may further include a normal program control block 50.

The normal program control block 50 may perform a normal program operation for programming target data FZDATA_IN inputted from an external device into the non-volatile memory 10 after the pre-boot-up operation, the self-program operation and the post-boot-up operation are performed.

The target data FZDATA_IN may represent defective addresses of the defective cells of the normal cell region 62, which are detected as a result of a test operation performed on the memory array region 60.

The normal program control block 50 may program the target data FZDATA_IN into the normal region 12 based on the input address ADD while comparing the input address ADD with the defective address LADD of the defective fuse cell provided as data FZDATA_S from the self-repair region 14. When the input address ADD coincides with the data FZDATA_S of the self-repair region 14, the normal program control block 50 may control a program operation of programming the target data FZDATA_IN into the redundancy region 16 instead of the normal region 12.

The normal program control block 50 may perform the normal program operation in response to a program enable signal RUP_EN.

The normal program control block 50 may include a third latch unit 52, a second comparison unit 54, and a second path control unit 56.

The third latch unit 52 and the second comparison unit 54 may have substantially the same structures as the second latch unit 42 and the first comparison unit 44, respectively. According to an embodiment, the third latch unit 52 and the second latch unit 42 may be composed of the same latch circuit, and the second comparison unit 54 and the first comparison unit 44 may be composed of the same comparison circuit.

The second path control unit 56 may program the target data FZDATA_IN into the normal region 12 based on the input address ADD. However, when the redundancy enable signal REDEN is generated, the second path control unit 56 may control a program operation of programming the target data FZDATA_IN into the redundancy region 16 instead of the normal region 12.

As described above, the non-volatile memory 10 as the ARE circuit may further include the self-repair region 14 and the redundancy region 16 in addition to the normal region 12. When the defects occur in the normal region 12, the address of the defective cells of the normal region 12 may be stored in the self-repair region 14, and the defective cells of the normal region 12 may be repaired using the cells of the redundancy region 16 according to the address of the defective cells stored in the self-repair region 14. Accordingly, as the defective cells of the normal region 12 are replaced with the cells of the redundancy region 16, a yield of the semiconductor device may be improved.

Figure 2:
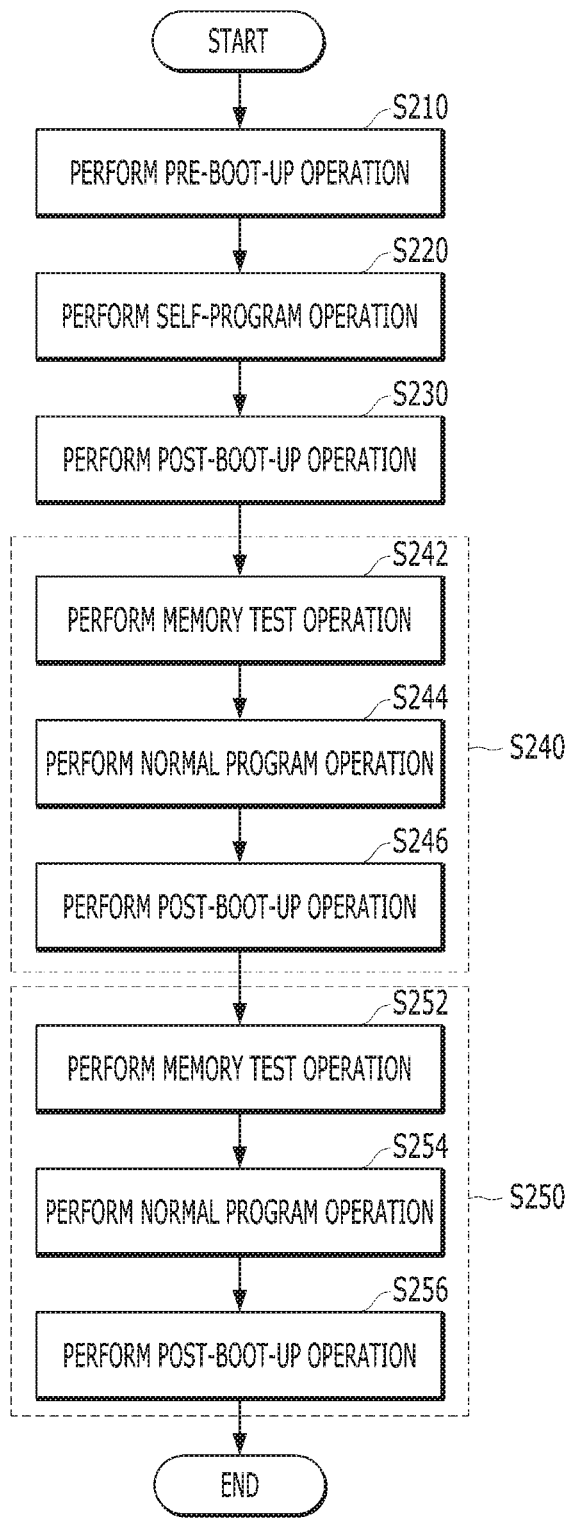
FIG. 2 is a timing diagram illustrating an operation of a semiconductor device shown in FIG. 1.

FIG. 2 is a timing diagram illustrating an operation of the semiconductor device shown in FIG. 1.

Referring to FIG. 2, the semiconductor device may sequentially perform the pre-boot-up operation in step S210, the self-program operation in step S220, the post-boot-up operation in step S230, a wafer repair operation in step S240, and a package repair operation in step S250.

The pre-boot-up operation in step S210 may be controlled by the pre-boot-up control block 20 shown in FIG. 1. The pre-boot-up operation in step S210 may be performed to detect a defective cell of the normal region 12 and store as the data FZDATA_S the defective address LADD of the defective fuse cell in the initial state when the non-volatile memory 10 as the ARE circuit is not programmed.

The self-program operation in step S220 may be controlled by the self-program control block 30 shown in FIG. 1. The self-program operation in step S220 may be performed to program the defective address LADD into the self-repair region 14. The self-program operation in step S220 may be performed automatically after the pre-boot-up operation in step S210 is terminated.

The post-boot-up operation in step S230 may be controlled by the post-boot-up control block 40 shown in FIG. 1. The post-boot-up operation in step S230 may be performed to read out the data FZDATA_N of the normal region 12 based on the input address ADD but to output the data FZDATA_R of the redundancy region 16 instead of the data FZDATA_N of the normal region 12 when the input address ADD coincides with the data FZDATA_S (i.e., the defective address LADD of the defective fuse cell in the normal region 10) of the self-repair region 14.

Subsequently, the semiconductor device may store as the target data FZDATA_IN, defective addresses of the defective cells of the normal cell region 62, which are detected as the result of the test operation performed on the memory array region 60, in an external test device.

When the test operation is completed, the semiconductor device may program the defective addresses (i.e., the target data FZDATA_IN) of the defective cells into the non-volatile memory 10. The defective addresses (i.e., the target data FZDATA_IN) of the defective cells may be stored as one of the data FZDATA_N into the normal region 12 and the data FZDATA_R into the redundancy region 16 according to a defective fuse cell of the normal region 12.

After reading out the data FZDATA from the non-volatile memory 10 during an initialization operation, i.e., a power-up operation, the semiconductor device may store the data FZDATA, which is one of the data FZDATA_N of the normal region 12 and the data FZDATA_R of the redundancy region 16, in the latch circuit 70 and may perform a repair operation to replace the defective cells of the normal cell region 62 with the cells of the redundancy cell region 64 by using the data FZDATA stored in the latch circuit 70.

The repair operation may be largely divided into the wafer repair operation in step S240 which is performed in a wafer state and the package repair operation in step S250 which is performed in a package state.

The wafer repair operation in step S240 may include a memory test operation in step S242, the normal program operation in step S244, and the post-boot-up operation in step S246.

During the memory test operation in step S242, the defective addresses of the defective cells in the normal cell region 62 may be detected as the result of the test operation performed on the memory array region 60 at a wafer level. The defective addresses of the defective cells in the normal cell region 62 may be stored as the target data FZDATA_IN in the external test device.

When the memory test operation in step S242 is completed, the normal program operation in step S244 may be performed to program the defective address representing the defective cells in the normal cell region 62 into the non-volatile memory 10.

The normal program operation in step S244 may be performed by the normal program control block 50 shown in FIG. 1.

The normal program operation in step S244 may be performed to program the target data FZDATA_IN (i.e., the defective address representing the defective cells of the normal cell region 62) as the data FZDATA_N into the normal region 12 of the non-volatile memory 10 based on the input address ADD but to program the target data FZDATA_IN as the data FZDATA_R in the cells of the redundancy region 16 instead of the cells of the normal region 12 when the input address ADD coincides with the defective address LADD (i.e., the data FZDATA_S) stored in the self-repair region 14.

The post-boot-up operation in step S246 may be performed to read out the data FZDATA, which is one of the data FZDATA_N of the normal region 12 and the data FZDATA_R of the redundancy region 16, from the non-volatile memory 10. The post-boot-up operation in step S246 may be performed after the normal program operation in step S244 is performed.

Since the post-boot-up operation in step S246 is substantially the same as the post-boot-up operation in step S230, detailed descriptions thereof are omitted herein.

The package repair operation in step S250 may include the memory test operation in step S252, the normal program operation in step S254, and the post-boot-up operation in step S256.

Since the memory test operation in step S252, the normal program operation in step S254 and the post-boot-up operation in step S256 are substantially the same as the memory test operation in step S242, the normal program operation in step S244 and the post-boot-up operation in step S246, detailed descriptions thereof are omitted herein.

Although FIG. 2 illustrates that the wafer repair operation in step S240 and the package repair operation in step S250 are performed only once, the semiconductor device may be tested several times at the wafer level or a package level, and thus the wafer repair operation and the package repair operation may be repeated.

In accordance with an embodiment of the present invention as described above, as the defective fuse cells of the normal region 12 included in the non-volatile memory 10 are replaced with the cells of the redundancy region 16 through the pre-boot-up operation in step S210, the self-program operation in step S220 and the post-boot-up operation in step S230 before the wafer repair operation in step S240 and the package repair operation in step S250 are performed, the yield of the semiconductor device may be improved.

Hereinafter, a semiconductor device is described along with specific structures for controlling a non-volatile memory in accordance with an embodiment of the present invention.

Figure 3:
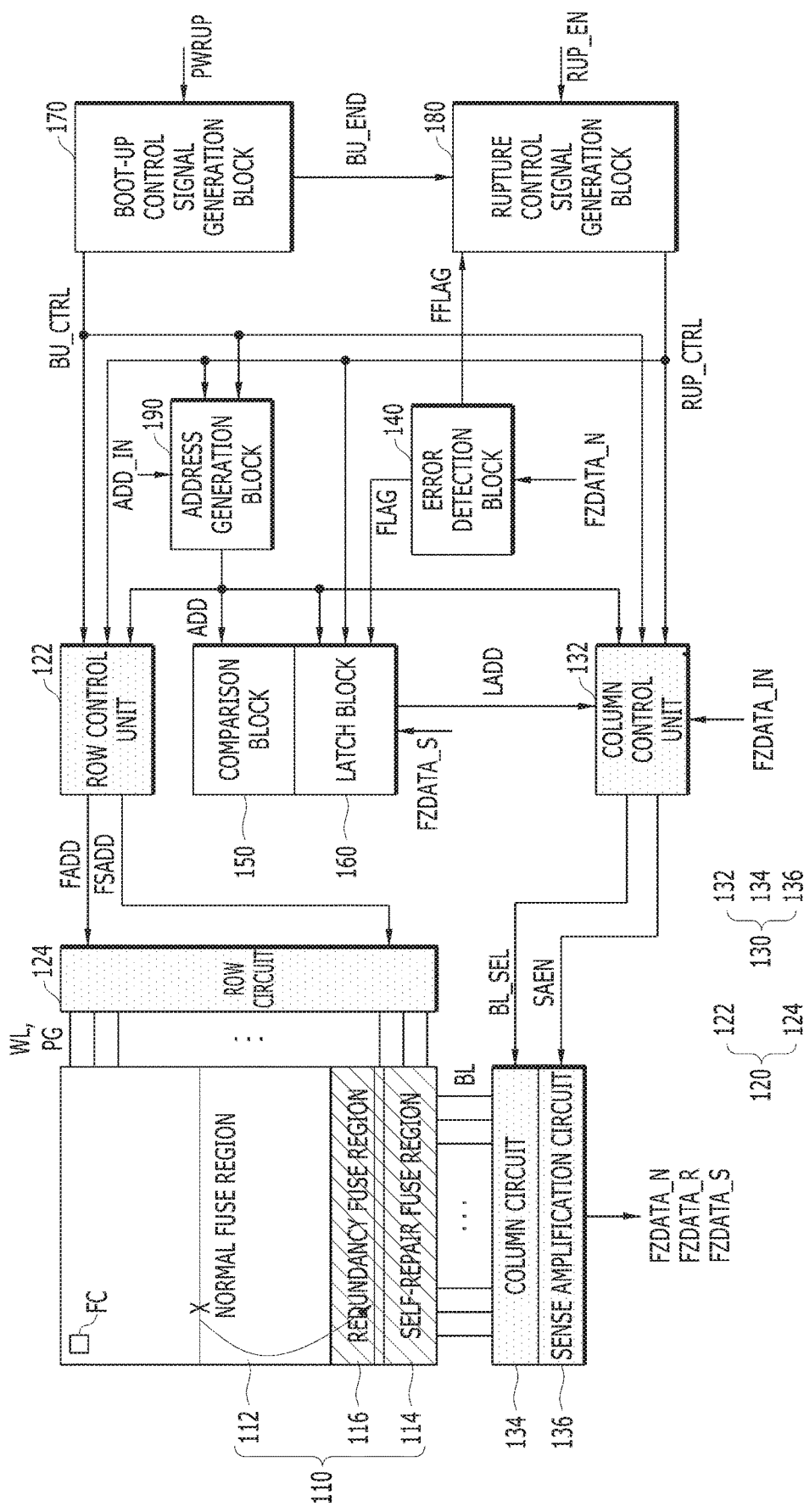
FIG. 3 is a block diagram illustrating a semiconductor device for a row repair in accordance with an embodiment of the present invention.

FIG. 3 is a block diagram illustrating a semiconductor device for a row repair in accordance with an embodiment of the present invention.

Referring to FIG. 3, the semiconductor device may include the non-volatile memory 110, an operation control block 120 and 130 for controlling an operation of the non-volatile memory 110, an error detection block 140, a comparison block 150, and a latch block 160.

The non-volatile memory 110 may be the same as the non-volatile memory 10 described with reference to FIGS. 1 and 2. Hereinafter, it is described as an example that the non-volatile memory 110 is composed of the array E-fuse (ARE) circuit. The ARE circuit 110 may include a plurality of fuse cells FC disposed at cross points of row lines WL and column lines BL.

The ARE circuit 110 may include a normal fuse region 112, a self-repair fuse region 114, and a redundancy fuse region 116, each having the plurality of fuse cells FC. The normal fuse region 112, the self-repair fuse region 114 and the redundancy fuse region 116 may correspond to the normal region 12, the self-repair region 14 and the redundancy region 16 shown in FIG. 1, respectively.

In accordance with an embodiment of the present invention, the operation of the semiconductor device may be largely divided into a pre-boot-up operation, a self-rupture operation, a normal rupture operation, and a post-boot-up operation. The pre-boot-up operation and the post-boot-up operation may read out data programmed into the ARE circuit 110, and the self-rupture operation and the normal rupture operation may program target data into the ARE circuit 110.

The self-rupture operation may be performed automatically according to detection of defective cells in the normal fuse region 112 after the pre-boot-up operation is completed.

The normal rupture operation may be performed in response to a command inputted from an external device, for example, a rupture enable signal RUP_EN.

The operation control block 120 and 130 may control an operation of the ARE circuit 110 based on an input address ADD.

During the pre-boot-up operation, the operation control block 120 and 130 may control the ARE circuit 110 to read out normal fuse data FZDATA_N having predetermined initial values or an error from the normal fuse region 112.

During the self-rupture operation, the operation control block 120 and 130 may control the ARE circuit 110 to program a defective address LADD stored in the latch block 160 into the self-repair fuse region 114.

During the post-boot-up operation, the operation control block 120 and 130 may control the ARE circuit 110 to read out self-fuse data FZDATA_S of the self-repair fuse region 114 in order to determine whether the input address ADD is identical to the defective address LADD of the defective fuse cell provided as the data FZDATA_S, thereby generating a redundancy enable signal REDEN. Further, the operation control block 120 and 130 may control the ARE circuit 110 to read out one of the normal fuse data FZDATA_N of the normal fuse region 112 and redundancy fuse data FZDATA_R of the redundancy fuse region 116 according to the redundancy enable signal REDEN.

During the pre-boot-up operation, the error detection block 140 may detect defective fuse cells of the normal fuse region 112 based on the normal fuse data FZDATA_N, which have predetermined initial values or an error and are read out from the normal fuse region 112, to store in the latch block 160 the defective address LADD representing the defective fuse cell in the normal fuse region 112.

In the present invention, the pre-boot-up operation may be performed in an initial state where the ARE circuit 110 is not programmed, that is, before the self-rupture operation is performed. Accordingly, the error detection block 140 may generate an error flag signal FLAG when the defective fuse cell that does not have a predetermined initial value among the fuse cells of the normal fuse region 112 is detected, and the latch block 160 may store the input address ADD, which is inputted when the error flag signal FLAG is generated, as the defective address LADD.

The error detection block 140 may output a final flag signal FFLAG according to the generated error flag signal FLAG.

During the post-boot-up operation, the comparison block 150 may compare the input address ADD with the self-fuse data FZDATA_S, which is the defective address LADD of the defective fuse cell in the normal fuse region 112 and read out from the self-repair fuse region 114, and may generate the redundancy enable signal REDEN when the input address ADD coincides with the self-fuse data FZDATA_S. The post-boot-up operation may be performed after the ARE circuit 110 is programmed through the self-rupture operation or the normal rupture operation.

During the normal rupture operation, the comparison block 150 may compare the self-fuse data FZDATA_S (i.e., the defective address LADD of the defective fuse cell in the normal fuse region 112) stored in the latch block 160 with the input address ADD and may generate the redundancy enable signal REDEN when the self-fuse data FZDATA_S coincides with the input address ADD. During the normal rupture operation, the operation control block 120 and 130 may control the ARE circuit 110 to program target data FZDATA_IN (i.e., the defective address of the defective cells in the normal cell region 62) into the normal fuse region 112 based on the input address ADD but to program the target data FZDATA_IN into fuse cells of the redundancy fuse region 116 instead of the fuse cells of the normal fuse region 112 according to the redundancy enable signal REDEN.

Accordingly, the latch block 160 may store the defective address LADD of the defective fuse cells in the normal fuse region 112 during the pre-boot-up operation and the self-rupture operation and may store the self-fuse data FZDATA_S which is also the defective address LADD of the defective fuse cell in the normal fuse region 112 and is read out from the self-repair fuse region 114 during the normal rupture operation and the post-boot-up operation.

The semiconductor device may further include a boot-up control signal generation block 170, a rupture control signal generation block 180, and an address generation block 190.

The boot-up control signal generation block 170 may generate a boot-up control signal BU_CTRL in response to a power-up signal PWRUP provided during an initialization operation, i.e., a power-up operation.

The boot-up control signal generation block 170 may generate the boot-up control signal BU_CTRL indicating the pre-boot-up operation when it is determined as the initial state when the ARE circuit 110 is not programmed and may generate the boot-up control signal BU_CTRL indicating the post-boot-up operation when it is determined that the ARE circuit 110 has been programmed.

Also, the boot-up control signal generation block 170 may output a boot-up termination signal BU_END when the pre-boot-up operation is completed.

Whether the ARE circuit 110 is programmed or not may be determined in various ways. For example, whenever a program operation is performed on the ARE circuit 110, a specific cell of a specific non-volatile memory may be programmed, and the boot-up control signal generation block 170 may read out data of the cell. In this manner, whether the ARE circuit 110 is programmed or not may be determined.

The rupture control signal generation block 180 may generate a rupture control signal RUP_CTRL indicating the self-rupture operation in response to the final flag signal FFLAG and the boot-up termination signal BU_END. In addition, the rupture control signal generation block 180 may generate the rupture control signal RUP_CTRL indicating the normal rupture operation in response to the rupture enable signal RUP_EN inputted from the external device.

The address generation block 190 may generate the input address ADD based on the boot-up control signal BU_CTRL or the rupture control signal RUP_CTRL. The address generation block 190 may generate the input address ADD corresponding to a target address ADD_IN inputted from the external device when the rupture control signal RUP_CTRL indicating the normal rupture operation is inputted. Although FIG. 3 shows that the target address ADD_IN and the target data FZDATA_IN are separate signals, the present invention is not limited thereto. According to embodiments, the target address ADD_IN included in the target data FZDATA_IN may be transmitted.

Figure 4:
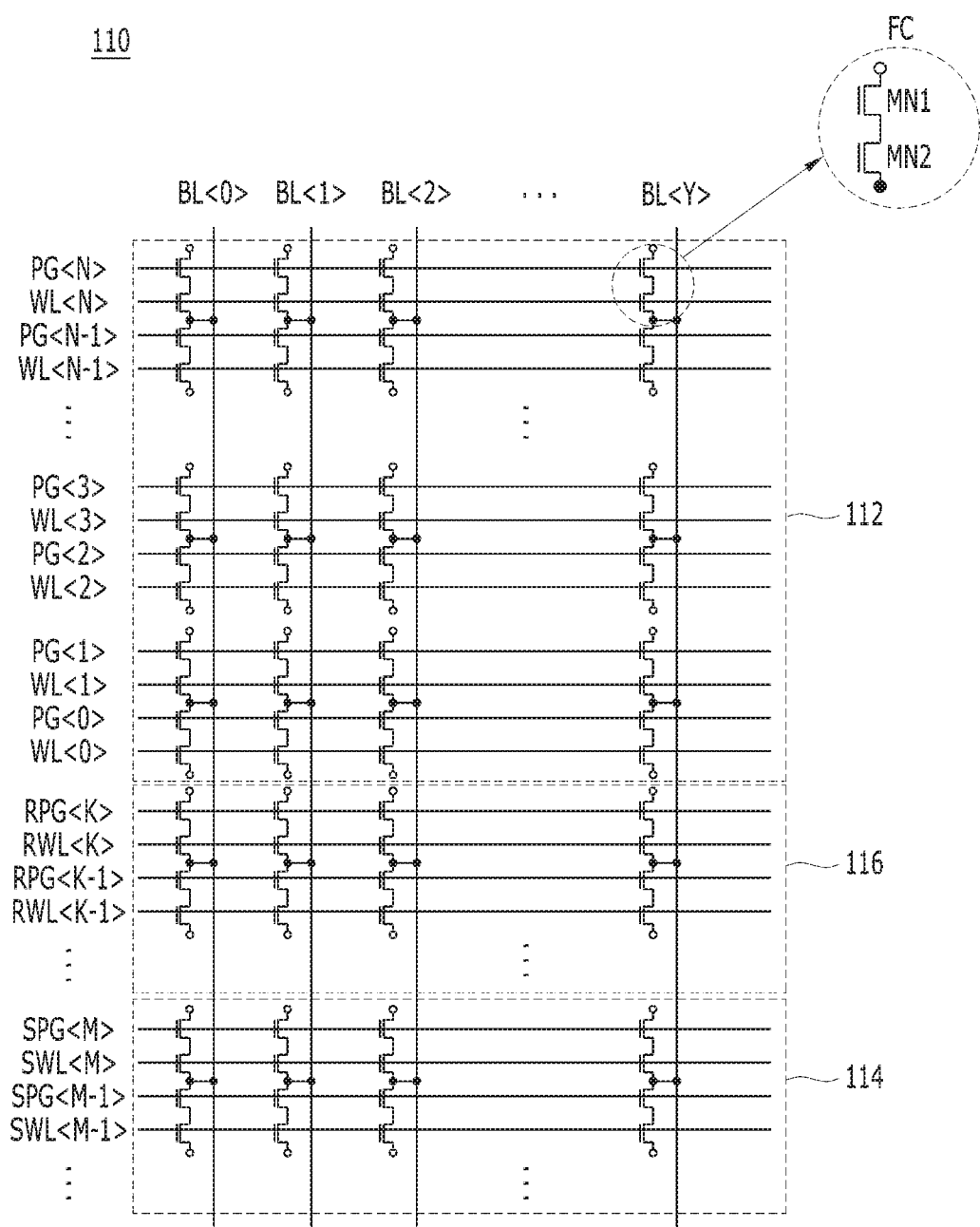
FIG. 4 is a diagram illustrating a coupling of a non-volatile memory and peripheral constituents shown in FIG. 3.

FIG. 4 is a diagram illustrating a coupling of a non-volatile memory 110 and peripheral constituents shown in FIG. 3.

Referring to FIG. 4, the ARE circuit 110 in accordance with an embodiment of the present invention may include the normal fuse region 112, the self-repair fuse region 114, and the redundancy fuse region 116, each having the plurality of fuse cells FC. The normal fuse region 112 may be selectively programmed using program voltages PG<0:N>, and the plurality of fuse cells FC coupled to row lines WL<0:N> and column lines BL<0:Y> may be arranged in an array shape in the normal fuse region 112. The self-repair fuse region 114 may be selectively programmed using program voltages SPG<0:M>, and the plurality of fuse cells FC coupled to row lines SWL<0:M> and the column lines BL<0:Y> may be arranged in an array shape in the self-repair fuse region 114. The redundancy fuse region 116 may be selectively programmed using program voltages RPG<0:K>, and the plurality of fuse cells FC coupled to row lines RWL<0:K> and the column lines BL<0:Y> may be arranged in an array shape in the redundancy fuse region 116. The fuse cells FC of the normal fuse region 112, the self-repair fuse region 114 and the redundancy fuse region 116 may have the same structure and share the column lines BL<0:Y>.

Each of the fuse cells FC may include a first NMOS transistor MN1 having a source coupled to a source voltage terminal and a gate receiving a corresponding program voltage PG and a second NMOS transistor MN2 having a source coupled to a drain of the first NMOS transistor, a drain coupled to a corresponding column line BL and a gate coupled to a corresponding row line WL. A voltage level of the source voltage terminal may vary depending on a level of the program voltage PG. In other words, since it is only necessary to generate a gate-source voltage Vgs, e.g., 6V, to the extent that a gate insulating film of the first NMOS transistor MN1 is destroyed, a ground voltage may be applied to the source voltage terminal when the program voltage PG is sufficiently high, and a negative voltage may be applied to the source voltage terminal when the program voltage PG is low.

The program voltage PG may have a high voltage level to rupture the fuse cells FC when the fuse cells FC are programmed, that is, during the self-rupture operation or the normal rupture operation. The program voltage PG may have a voltage level that is lower than the high voltage level, i.e., a voltage level of approximately ½, when the fuse cells FC are read out, that is, during the pre-boot-up operation or the post-boot-up operation. Therefore, during the rupture operations, when one row line WL is selected, a plurality of the second NMOS transistors MN2 coupled to the row line WL may be turned on, and a plurality of the first NMOS transistors MN1 may be coupled to the corresponding column lines BL. When the column lines BL are sequentially selected, the first NMOS transistors MN1 coupled to the selected column lines BL may be sequentially programmed based on the program voltage having the high voltage level. During the boot-up operations, when one row line WL is selected, the plurality of the second NMOS transistors coupled to the row line WL may be turned on, and the plurality of the first NMOS transistors MN1 may be coupled to the corresponding column lines BL. The fuse data may be outputted at one time through the column lines BL based on whether or not the first NMOS transistors MN1 are ruptured.

Referring back to FIG. 3, the operation control block 120 and 130 may include a row operation control block 120 for selecting the row line WL of the ARE circuit 110 and applying the program voltage PG to the selected row line WL, and a column operation control block 130 for controlling the column line BL.

The row operation control block 120 may include a row control unit 122 and a row circuit 124.

The row control unit 122 may output a fuse address FADD or a fuse address FSADD based on the boot-up control signal BU_CTRL, the rupture control signal RUP_CTRL, the input address ADD and the redundancy enable signal REDEN or the boot-up control signal BU_CTRL and the rupture control signal RUP_CTRL. The fuse address FADD may be an address for selecting the row lines WL<0:N> of the normal fuse region 112 or the row lines RWL<0:K> of the redundancy fuse region 116, and the fuse address FSADD may be an address for selecting the row lines SWL<0:M> of the self-repair fuse region 114.

The row control unit 122 may output the fuse address FADD so that the row lines WL<0:N> of the normal fuse region 112 are sequentially selected during the pre-boot-up operation, and output the fuse address FSADD so that the row lines SWL<0:M> of the self-repair fuse region 114 are selected during the self-rupture operation. After outputting the fuse address FSADD so that the row lines SWL<0:M> of the self-repair fuse region 114 are selected during the post-boot-up operation, the row control unit 122 may output the fuse address FADD so that the row lines WL<0:N> of the normal fuse region 112 or the row lines RWL<0:K> of the redundancy fuse region 116 are selected based on the redundancy enable signal REDEN. Besides, the row control unit 122 may output the fuse address FADD so that the row lines WL<0:N> of the normal fuse region 112 or the row lines RWL<0:K> of the redundancy fuse region 116 are selected based on the redundancy enable signal REDEN during the normal rupture operation.

The row circuit 124 may select the row line WL of a specific fuse cell FC based on the fuse address FADD and the fuse address FSADD outputted from the row control unit 122 and may apply the program voltage PG to the selected row line WL.

The column operation control block 130 may include a column control unit 132, a column circuit 134, and a sense amplification circuit 136.

The column control unit 132 may generate a column line selection signal BL_SEL and a sense amplification enable signal SAEN for selecting the column lines BL<0:Y> based on the boot-up control signal BU_CTRL, the rupture control signal RUP_CTRL, the input address ADD and the defective address LADD stored in the latch block 160.

The column control unit 132 may generate the column line selection signal BL_SEL and the sense amplification enable signal SAEN so that the column lines BL<0:Y> are selected at one time based on the input address ADD during the pre-boot-up operation or the post boot-t up operation. The column control unit 132 may generate the column line selection signal BL_SEL and the sense amplification enable signal SAEN so that at least one of the column lines BL<0:Y> is sequentially selected based on the input address ADD and the defective address LADD stored in the latch block 160 during the self-rupture operation. Besides, the column control unit 132 may generate the column line selection signal BL_SEL and the sense amplification enable signal SAEN so that at least one of the column lines BL<0:Y> is sequentially selected based on the input address ADD and the target address ADD_IN during the normal rupture operation.

The column circuit 134 may select a specific column line BL based on the column line selection signal BL_SEL. The sense amplification circuit 136 which is enabled based on the sense amplification enable signal SAEN may sense and amplify a level of the selected column line BL, thereby outputting the level as the fuse data FZDATA_N, FZDATA_S and FZDATA_R.

Hereinafter, an operation of the semiconductor device shown in FIG. 3 will be described with reference to FIGS. 3 to 8B.

Figure 5A:
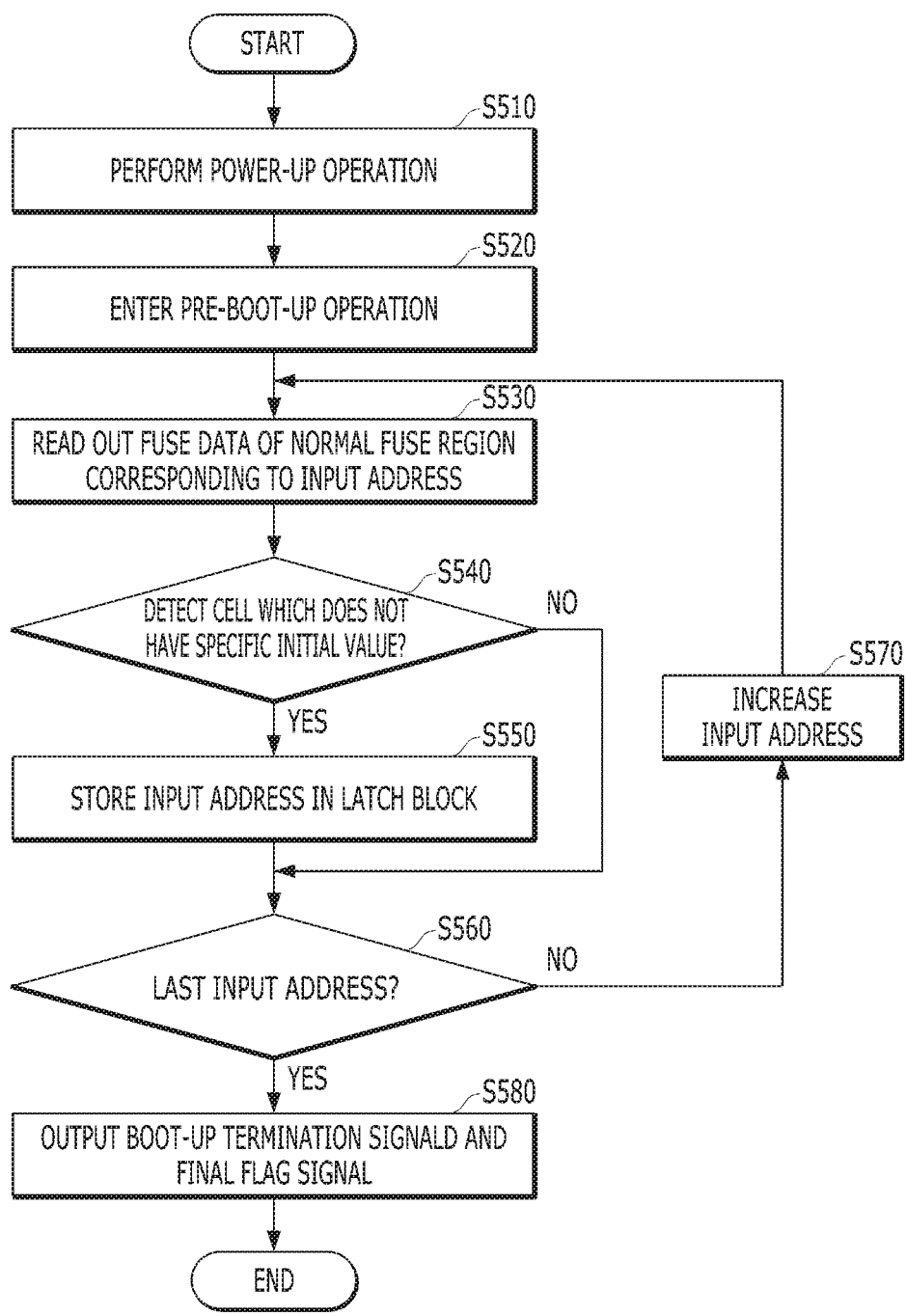
FIGS. 5A and 5B are a flowchart and a block diagram, respectively, illustrating a pre-boot-up operation of the semiconductor device shown in FIG. 3.
Figure 5B:
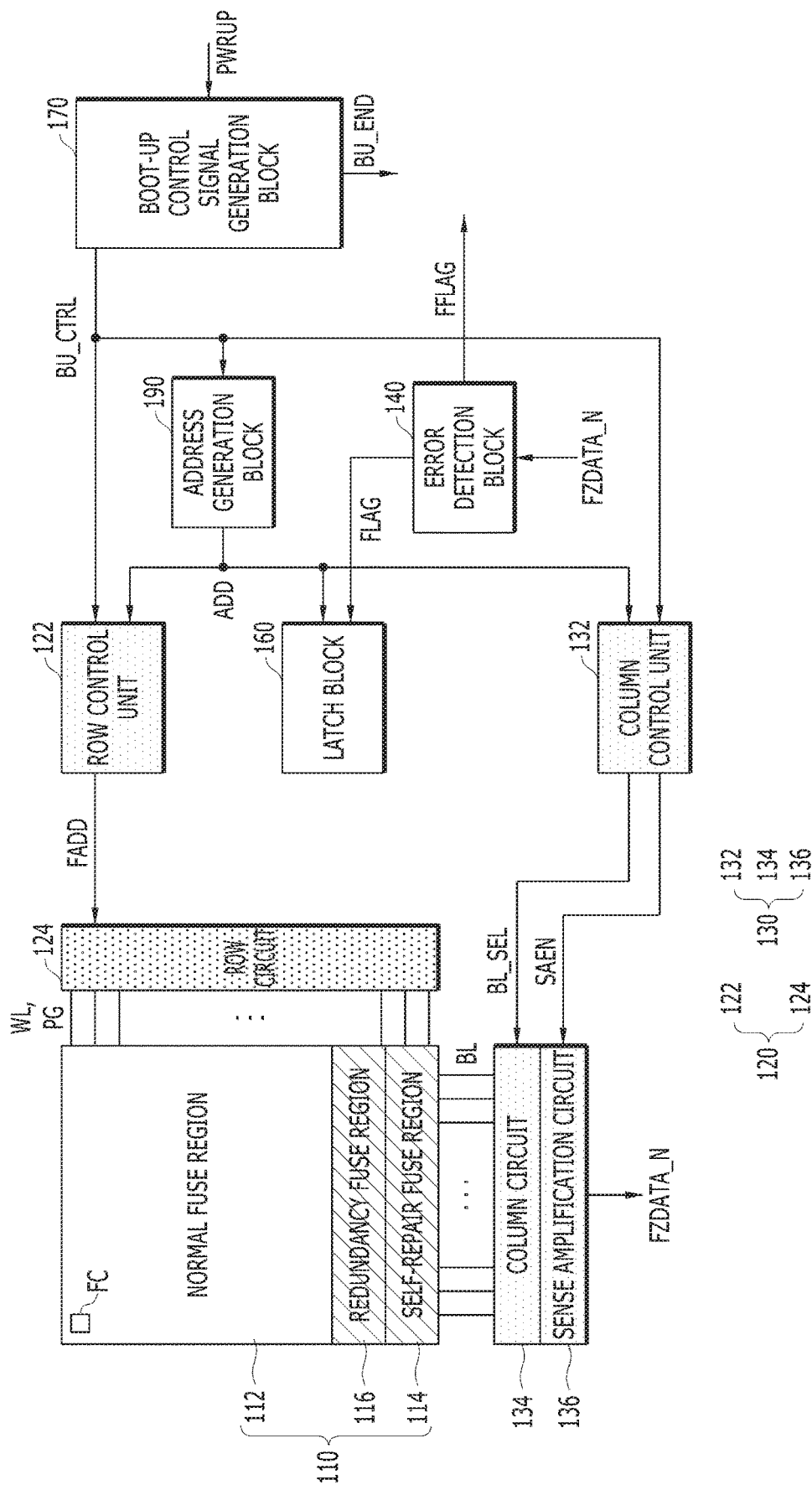

FIGS. 5A and 5B are a flowchart and a block diagram, respectively, illustrating the pre-boot-up operation of the semiconductor device shown in FIG. 3.

Referring to FIGS. 5A and 5B, the boot-up control signal generation block 170 may generate the boot-up control signal BU_CTRL in response to the power-up signal PWRUP generated during the initialization operation, i.e., the power-up operation in step S510. The boot-up control signal generation block 170 may generate the boot-up control signal BU_CTRL indicating the pre-boot-up operation when the ARE circuit 110 is determined as in the initial state and thus not programmed.

Therefore, the semiconductor device may perform the pre-boot-up operation in step S520.

The address generation block 190 may generate the input address ADD based on the boot-up control signal BU_CTRL. The operation control block 120 and 130 may read out the normal fuse data FZDATA_N of the normal fuse region 112 corresponding to the input address ADD based on the boot-up control signal BU_CTRL in step S530.

More specifically, based on the input address ADD and the boot-up control signal BU_CTRL, the row operation control block 120 may generate the fuse address FADD to select a first row line WL<0> of the normal fuse region 112, and the column operation control block 130 may generate the column line selection signal BL_SEL and the sense amplification enable signal SAEN so that the fuse data is outputted from the plurality of fuse cells coupled to the first row line WL<0>. Thus, the normal fuse data FZDATA_N corresponding to the first row line WL<0> of the normal fuse region 112 may be read out. During the pre-boot-up operation, the program voltage PG<0> having the voltage level that is lower than the high voltage may be applied to the plurality of fuse cells coupled to the first row line WL<0>, and the ground voltage may be applied to the other fuse cells.

The error detection block 140 may detect whether or not there is the defective fuse cell that does not have the predetermined initial value among the fuse cells of the normal fuse region 112 based on the normal fuse data FZDATA_N in step S540. The normal fuse data FZDATA_N before being ruptured may have a logic low level as a default value, whereas the normal fuse data FZDATA_N outputted from the defective fuse cells caused by process defects may have a logic high level.

When the normal fuse data FZDATA_N is not the logic low level ("YES" in step S540), the error detection block 140 may generate the error flag signal FLAG by determining the row line WL<0> as a defect, and the latch block 160 may store the input address ADD, which is inputted when the error flag signal FLAG is generated, as the defective address LADD in step S550.

Since the input address ADD does not correspond to a last row line WL<N> of the normal fuse region 112 ("NO" in step S560), the address generation block 190 may sequentially increase the input address ADD in step S570.

The operation control block 120 and 130 may repeat the above-described operations S530 to S570 to detect the defective fuse cells by reading out the normal fuse data FZDATA_N of the normal fuse region 112 corresponding to the input address ADD.

When the operations S530 to S570 are completed as the input address ADD corresponding to the last row line WL<N> of the normal fuse region 112 is inputted ("YES" in step S560), the boot-up control signal generation block 170 may output the boot-up termination signal BU_END in step S580. In this case, the error detection block 140 may output the final flag signal FFLAG according to the generated error flag signal FLAG.

As described above, through the pre-boot-up operation, the defective fuse cells of the normal fuse region 112 may be detected and the defective address may be stored in the latch block 160.

Since the pre-boot-up operation is performed before the repair operation is performed on the defects of the memory array region 60 shown in FIG. 1, the fuse data outputted from the ARE circuit 110 may not be a defective address of a defective cell in the memory array region 60 but may have the predetermined initial value, and thus may not be stored in the latch circuit 70 shown in FIG. 1.

Although it is described in the embodiment of the present invention that the pre-boot-up operation is performed only on the normal fuse region 112, the present invention is not limited to this. According to embodiments, the pre-boot-up operation may be performed on the self-repair fuse region 114 and the redundancy fuse region 116, and in this case, a row line having defective fuse cells may be disabled in the self-repair fuse region 114 and the redundancy fuse region 116.

Figure 6A:
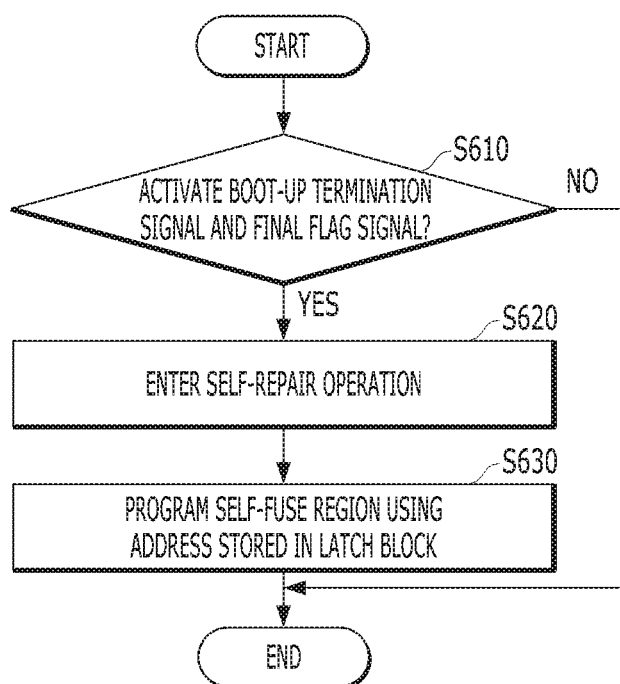
FIGS. 6A and 6B are a flowchart and a block diagram, respectively, illustrating a self-rupture operation of the semiconductor device shown in FIG. 3.
Figure 6B:
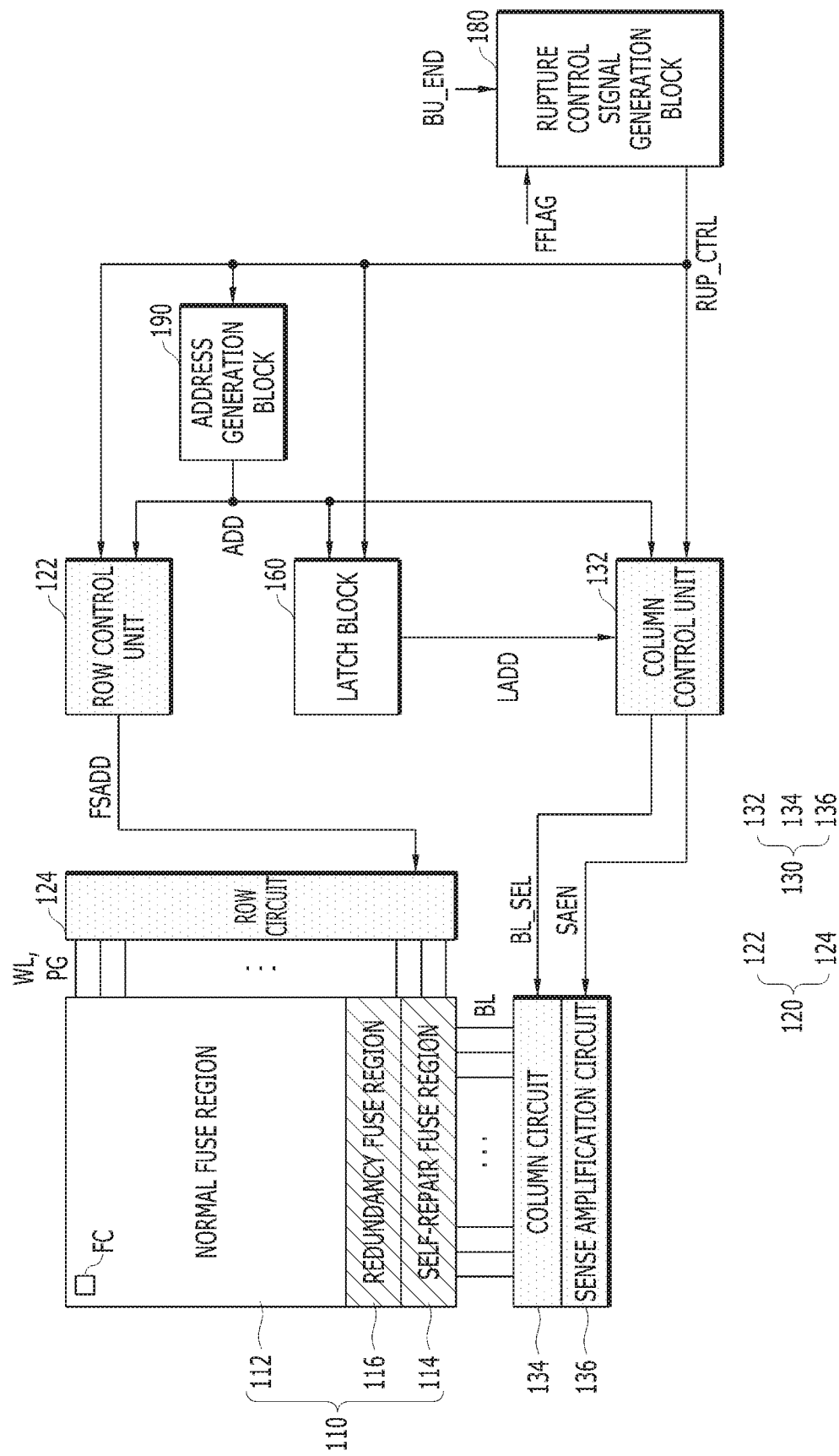

FIGS. 6A and 6B are a flowchart and a block diagram, respectively, illustrating the self-rupture operation of the semiconductor device shown in FIG. 3.

Hereinafter, it is assumed for the sake of convenience in description, that an eighth row line WL<7> and a $101^{st}$ row line WL<100> of the normal fuse region 112 are detected as defective row lines and addresses corresponding to the defective row lines are stored as the defective address LADD in the latch block 160 during the pre-boot up operation.

Referring to FIGS. 6A and 6B, when the final flag signal FFLAG and the boot-up termination signal BU_END are generated in step S610, the rupture control signal generation block 180 may automatically generate the rupture control signal RUP_CTRL indicating the self-rupture operation. Accordingly, the semiconductor device may perform the self-rupture operation in step S620.

The operation control block 120 and 130 may program the defective address LADD stored in the latch block 160 into the self-repair fuse region 114 corresponding to the input address ADD based on the rupture control signal RUP_CTRL in step S630.

More specifically, the address generation block 190 may generate the input address ADD corresponding to the self-repair fuse region 114 based on the rupture control signal RUP_CTRL. The latch block 160 may output the defective address LADD corresponding to the input address ADD based on the rupture control signal RUP_CTRL.

Based on the rupture control signal RUP_CTRL and the input address ADD, the row operation control block 120 may generate the fuse address FSADD so as to select a first row line SWL<0> of the self-repair fuse region 114, and the column operation control block 130 may generate the column line selection signal BL_SEL and the sense amplification enable signal SAEN so that the defective address LADD stored in the latch block 160 is sequentially programmed into the plurality of fuse cells coupled to the first row line SWL<0>. Accordingly, an address corresponding to the eighth row line WL<7> may be programmed into the fuse cells coupled to the first row line SWL<0> of the self-repair fuse region 114. During the self-rupture operation, the program voltage SPG<0> having the high voltage level may be applied to the plurality of fuse cells coupled to the first row line SWL<0>, and the ground voltage may be applied to the other fuse cells.

Subsequently, the address generation block 190 may generate the input address ADD which increases sequentially. The row operation control block 120 and the column operation control block 130 may program an address corresponding to the $101^{st}$ row line WL<100> into a second row line SWL<1> of the self-repair fuse region 114 based on the rupture control signal RUP_CTRL and the input address ADD.

As described above, through the self-rupture operation, the defective address LADD corresponding to the eighth row line WL<7> and the $101^{st}$ row line WL<100> of the normal fuse region 112 stored in the latch block 160 may be programmed as the self-fuse data FZDATA_S into the self-repair fuse region 114.

Figure 7A:
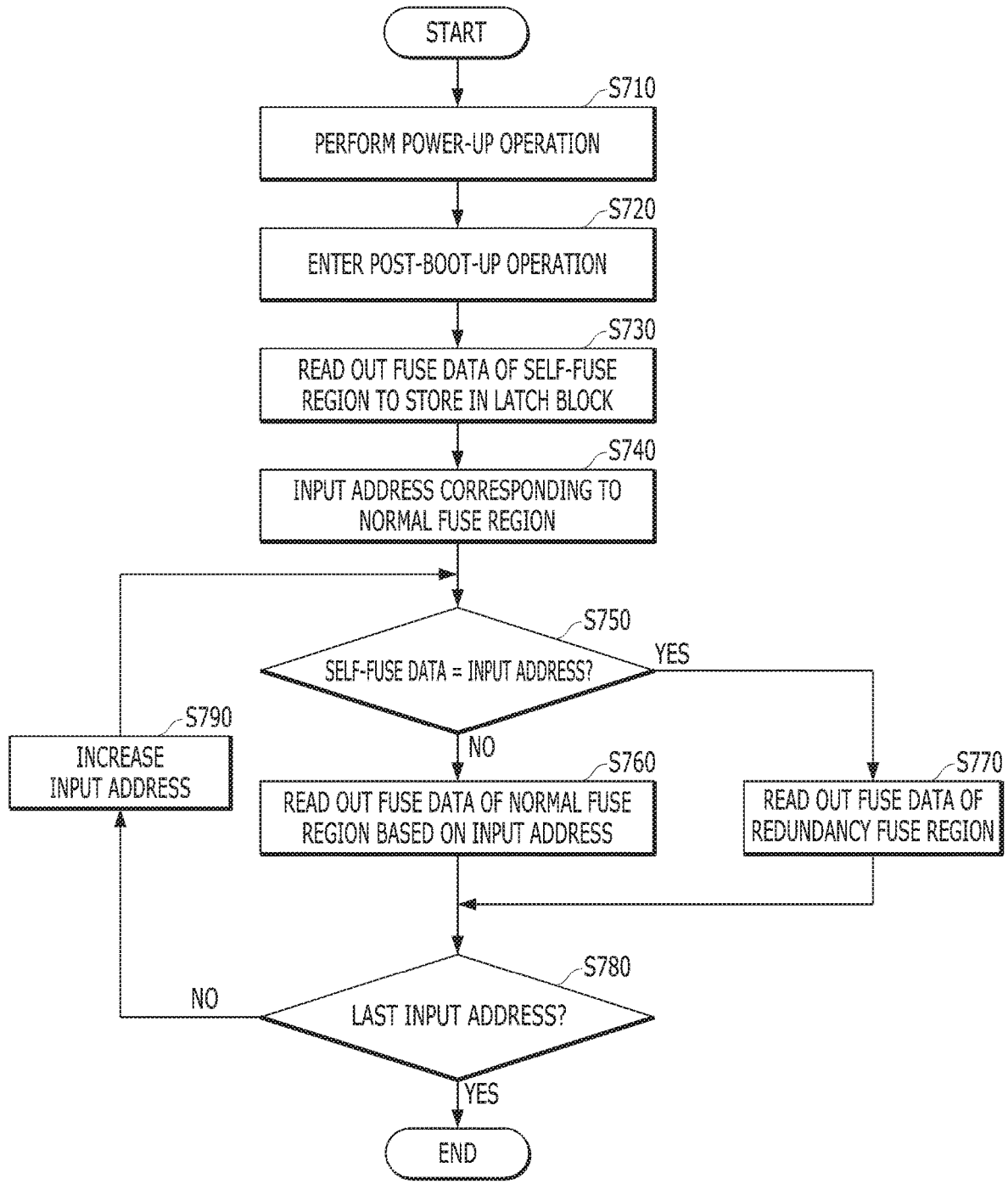
FIGS. 7A and 7B are a flowchart and a block diagram, respectively, illustrating a post-boot-up operation of the semiconductor device shown in FIG. 3.
Figure 7B:
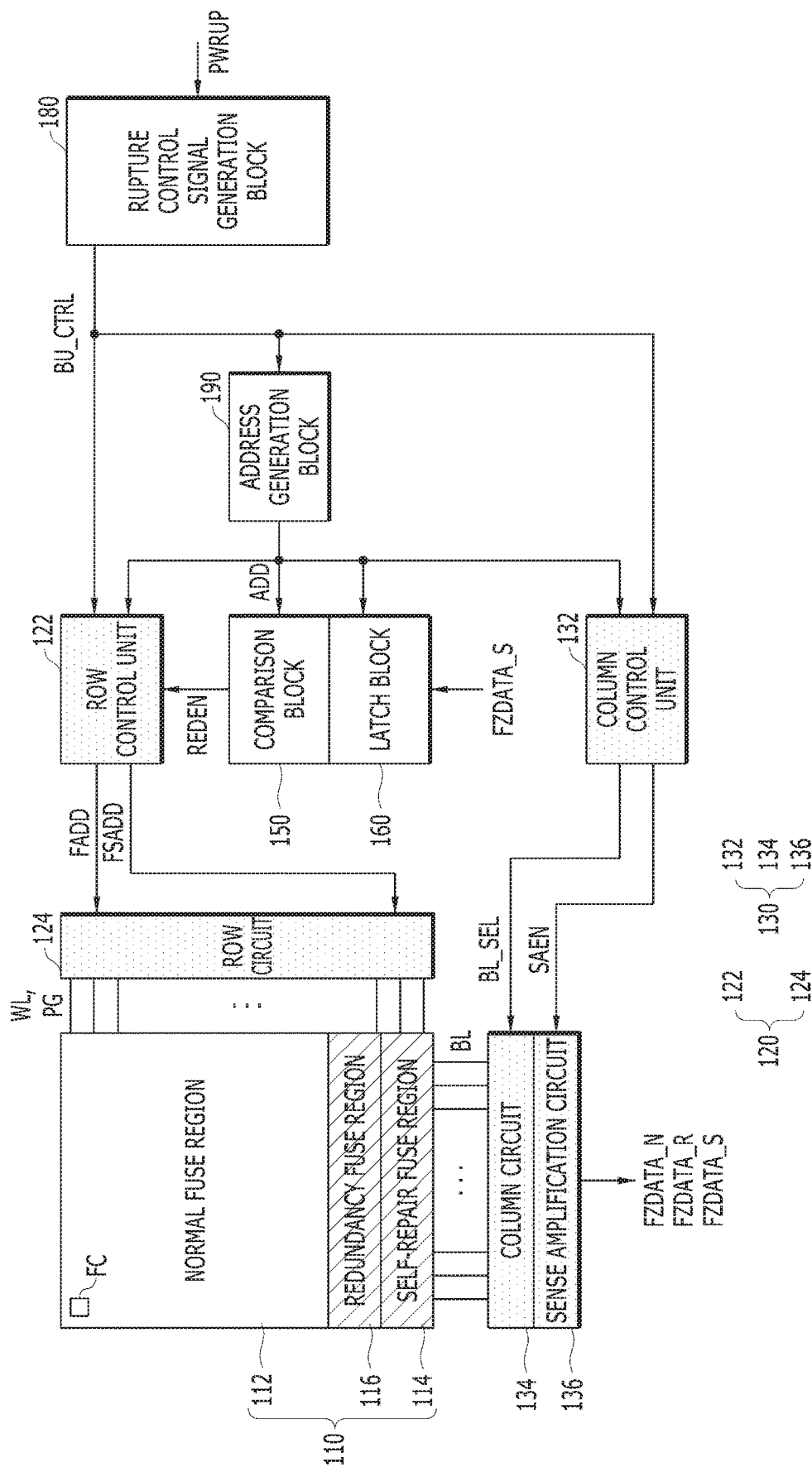

FIGS. 7A and 7B are a flowchart and a block diagram, respectively, illustrating the post-boot-up operation of the semiconductor device shown in FIG. 3.

Referring to FIGS. 7A and 7B, the boot-up control signal generation block 170 may generate the boot-up control signal BU_CTRL in response to the power-up signal PWRUP in step S710. The boot-up control signal generation block 170 may generate the boot-up control signal BU_CTRL indicating the post-boot-up operation after the ARE circuit 110 is programmed, that is, the self-rupture operation is performed. Accordingly, the semiconductor device may perform the post-boot-up operation in step S720.

The operation control block 120 and 130 may read out the self-fuse data FZDATA_S corresponding to the input address ADD from the self-repair fuse region 114 and store self-fuse data FZDATA_S, which is the defective address LADD of the defective fuse cell in the normal fuse region 112, in the latch block 160 based on the boot-up control signal BU_CTRL in step S730.

More specifically, the address generation block 190 may generate the input address ADD based on the boot-up control signal BU_CTRL. Based on the boot-up control signal BU_CTRL and the input address ADD, the row operation control block 120 may generate the fuse address FSADD so as to sequentially select row lines SWL<0:1> of the self-repair fuse region 114, and the column operation control block 130 may read out the self-fuse data FZDATA_S outputted from the selected row lines SWL<0:1>. The latch block 160 may store the self-fuse data FZDATA_S based on the input address ADD. Accordingly, the self-fuse data FZDATA_S corresponding to the eighth row line WL<7> and the $101^{st}$ row line WL<100> of the normal fuse region 112 may be stored in the latch block 160.

Subsequently, the address generation block 190 may initialize the input address ADD so that the normal fuse data FZDATA_N of the normal fuse region 112 are outputted in step S740. Accordingly, the row operation control block 120 may generate the fuse address FADD so as to select the first row line WL<0> of the normal fuse region 112.

The comparison block 150 may compare the self-fuse data FZDATA_S stored in the latch block 160 with the input address ADD in step S750.

When the self-fuse data FZDATA_S stored in the latch block 160 does not coincide with the input address ADD as a result of the comparison ("NO" in step S750), the operation control block 120 and 130 may read out the normal fuse data FZDATA_N from the fuse cells coupled to the row line WL of the normal fuse region 112 corresponding to the input address ADD in step S760.

When the input address ADD does not correspond to the last row line WL<N> of the normal fuse region 112 ("NO" in step S780), the address generation block 190 may sequentially increase the input address ADD in step S790.

When the input address ADD corresponds to the eighth row line WL<7> and the $101^{st}$ row line WL<100> of the normal fuse region 112 ("YES" in step S750), the comparison block 150 may generate the redundancy enable signal REDEN and the operation control block 120 and 130 may read out the redundancy fuse data FZDATA_R from the fuse cells coupled to row lines RWL<0:1> of the redundancy fuse region 116 instead of the normal fuse region 112 in step S770.

Until the input address ADD corresponding to the last row line WL<N> of the normal fuse region 112 is generated ("YES" in step S780), the operation control block 120 and 130 may repeat the above-described operations S750 to S780 to read out the normal fuse data FZDATA_N from the normal fuse region 112 corresponding to the input address ADD or the redundancy fuse data FZDATA_R from the redundancy fuse region 116.

As described above, through the post-boot-up operation, when the self-fuse data FZDATA_S of the self-repair fuse region 114 (i.e., the defective address LADD corresponding to the defective row line of the normal fuse region 112) coincides with the input address ADD while the normal fuse data FZDATA_N of the normal fuse region 112 corresponding to the input address ADD is read out, the redundancy fuse data FZDATA_R of the redundancy fuse region 116 instead of the normal fuse region 112 may be read out.

Since the post-boot-up operation is performed after the repair operation is performed on the defects of the memory array region 60 shown in FIG. 1, the normal fuse data FZDATA_N or the redundancy fuse data FZDATA_R, which is read out, may be stored in the latch circuit 70 shown in FIG. 1 and may be used when the repair operation is performed on the normal memory array region 62 of the memory array region 60.

Figure 8A:
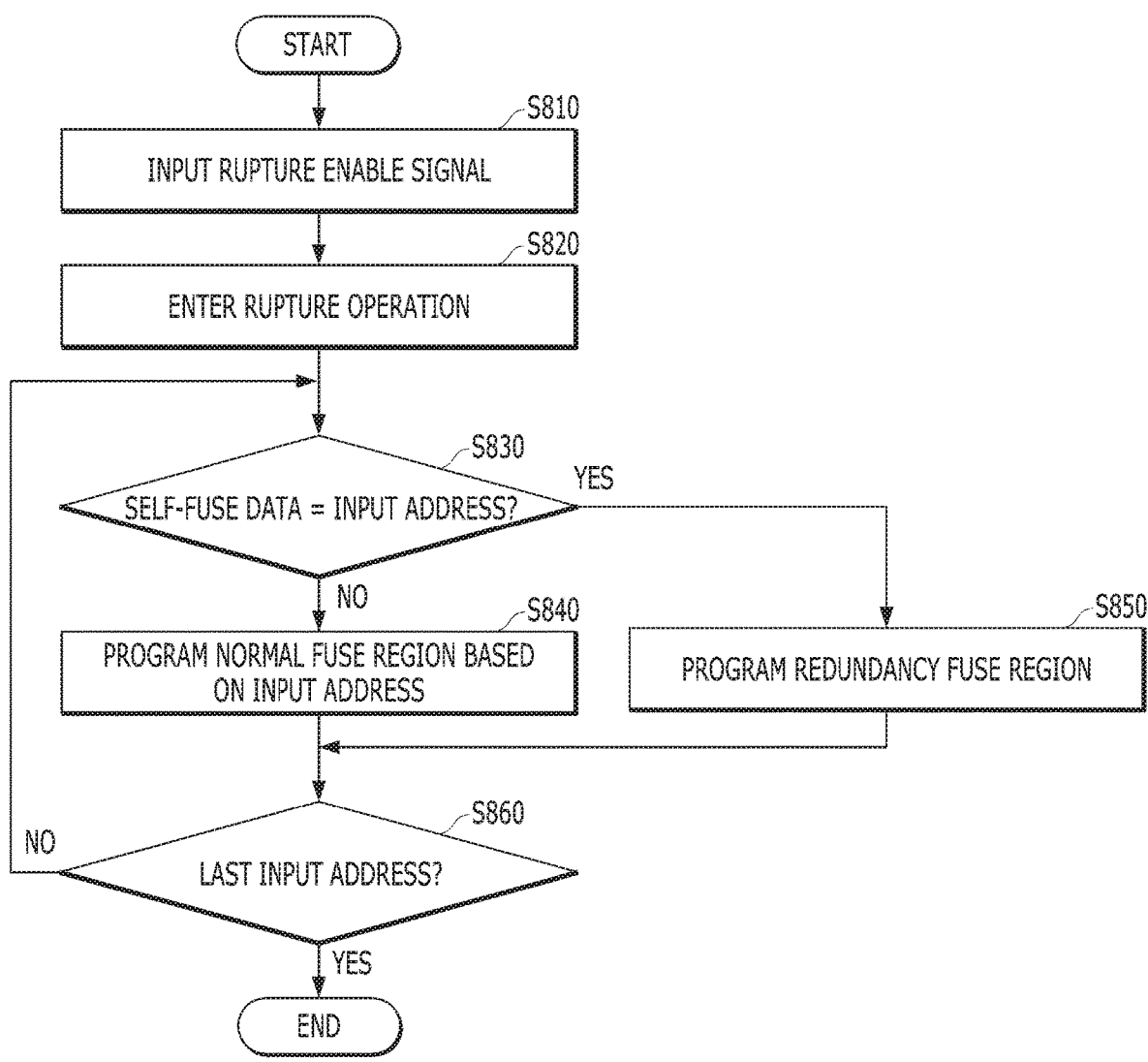
FIGS. 8A and 8B are a flowchart and a block diagram, respectively, illustrating a normal rupture operation of the semiconductor device shown in FIG. 3.
Figure 8B:
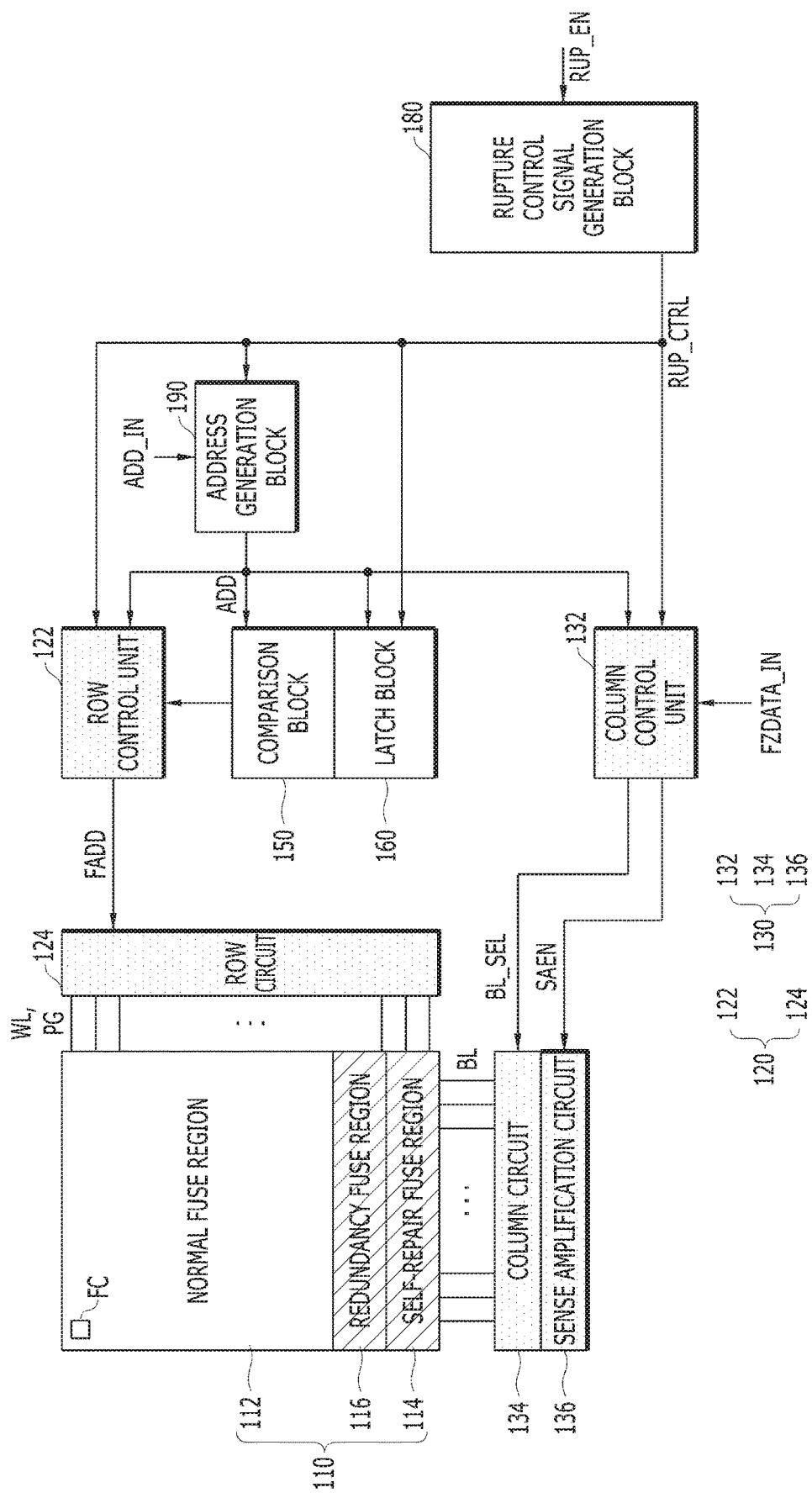

FIGS. 8A and 8B are a flowchart and a block diagram, respectively, illustrating the normal rupture operation of the semiconductor device shown in FIG. 3.

Referring to FIGS. 8A and 8B, the rupture control signal generation block 180 may generate the rupture control signal RUP_CTRL indicating the normal rupture operation in response to the rupture enable signal RUP_EN inputted from the external device in step S810. Accordingly, the semiconductor may perform the normal rupture operation in step S820.

Since the normal rupture operation is performed after the post-boot-up operation, which is described above with reference to FIGS. 7A and 7B, the self-fuse data FZDATA_S corresponding to the eighth row line WL<7> and the 101$^{st}$ row line WL<100> of the normal fuse region 112 may be already stored in the latch block 160.

The address generation block 190 may generate the input address ADD corresponding to the target address ADD_IN inputted from the external device based on the rupture control signal RUP_CTRL. The comparison block 150 may compare the self-fuse data FZDATA_S stored in the latch block 160 with the input address ADD in step S830.

When the target address ADD_IN coincides with the eighth row line WL<7> and the 101$^{st}$ row line WL<100> of the normal fuse region 112, the comparison block 150 may generate the redundancy enable signal REDEN.

When the target address ADD_IN does not coincide with the eighth row line WL<7> and the 101$^{st}$ row line WL<100> of the normal fuse region 112 ("NO" in step S830), the operation control block 120 and 130 may program the target data FZDATA_IN into the fuse cells coupled to the row line WL of the normal fuse region 112 corresponding to the input address ADD in step S840.

On the other hand, when the target address ADD_IN coincides with the eighth row line WL<7> and the 101$^{st}$ row line WL<100> of the normal fuse region 112 ("YES" in step S830), the redundancy enable signal REDEN is generated and the operation control block 120 and 130 may program the target data FZDATA_IN into the fuse cells coupled to the row lines RWL<0:1> of the redundancy fuse region 116 instead of the normal fuse region 112 in step S850.

Therefore, when the eighth row line WL<7> and the 101$^{st}$ row line WL<100> of the normal fuse region 112 are selected, the target data FZDATA_IN may be programmed into the row lines RWL<0:1> of the redundancy fuse region 116.

Until the input address ADD corresponding to the last target address ADD_IN of the normal fuse region 112 is generated in step S860, the operation control block 120 and 130 may repeat the above-described operations S830 to S850 to program the target data FZDATA_IN into the normal fuse region 112 or the redundancy fuse region 116 corresponding to the input address ADD.

As described above, through the normal rupture operation, in a case where the self-fuse data FZDATA_S which is already stored in the latch block 160, that is, the defective address LADD corresponding to the defective row line of the normal fuse region 112 coincides with the input address ADD while the target data FZDATA_IN is sequentially programmed into the normal fuse region 112 corresponding to the input address ADD, the target data FZDATA_IN may be programmed into the fuse cells of the redundancy fuse region 116 instead of the normal fuse region 112.

The pre-boot-up operation, the self-rupture operation, the post-boot-up operation and the normal rupture operation of the semiconductor device as described above with reference to FIGS. 5A to 8B may correspond to the pre-boot-up operation, the self-program operation, the post-boot-up operation and the normal program operation as described with reference to FIG. 2, respectively. In other words, in accordance with an embodiment of the present invention as described above, as the defective fuse cells of the normal region 112 included in the ARE circuit 110 are replaced with the fuse cells of the redundancy region 116 through the pre-boot-up operation, the self-rupture operation and the post-boot-up operation before the wafer repair operation and the package repair operation are performed, therefore the yield of the semiconductor device may be improved.

Figure 9:
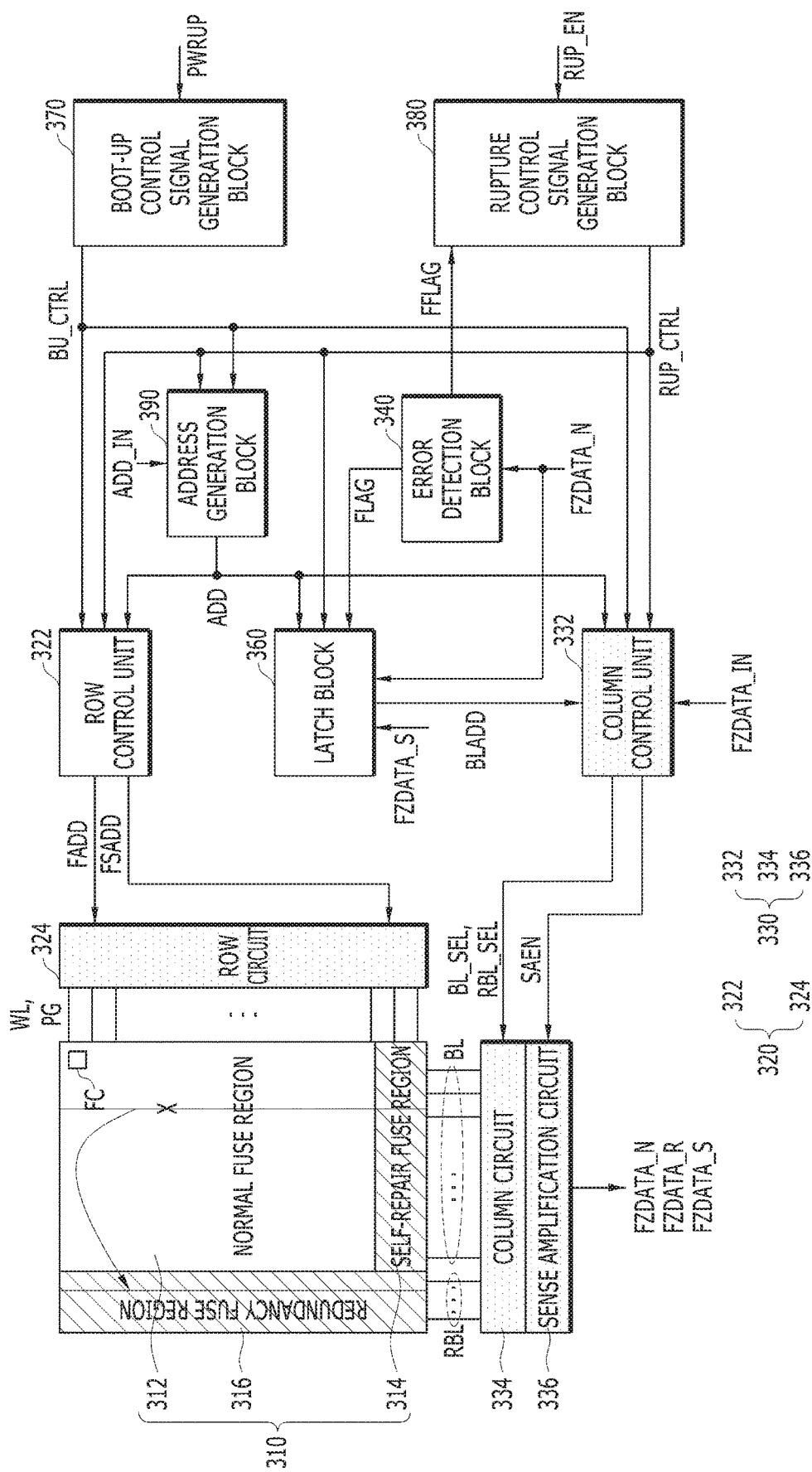
FIG. 9 is a block diagram illustrating a semiconductor device for a column repair in accordance with an embodiment of the present invention.

FIG. 9 is a block diagram illustrating a semiconductor device for a column repair in accordance with an embodiment of the present invention.

Referring to FIG. 9, the semiconductor device may include a non-volatile memory 310, an operation control block 320 and 330 for controlling an operation of the non-volatile memory 310, an error detection block 340, and a latch block 360. In addition, the semiconductor device may further include a boot-up control signal generation block 370, a rupture control signal generation block 380, and an address generation block 390.

The operation control block 320 and 330 may include a row operation control block 320 and a column operation control block 330. The row operation control block 320 may include a row control unit 322 and a row circuit 324, the column operation control block 330 may include a column control unit 332, a column circuit 334, and a sense amplification circuit 336. Since FIG. 9 is substantially the same as FIG. 3, overlapping descriptions will be omitted.

In a case where the non-volatile memory 310 is composed of an array E-fuse (ARE) circuit, the non-volatile memory 310 or the array E-fuse (ARE) circuit may include a plurality of fuse cells FC disposed at cross points of row lines WL and column lines BL. The ARE circuit 310 may include a normal fuse region 312, a self-repair fuse region 314, and a redundancy fuse region 316, each having the plurality of fuse cells FC.

The semiconductor device for the row repair of FIG. 3 may replace the row line WL of the normal fuse region 112 with the row line RWL of the redundancy fuse region 116, whereas the semiconductor device for the column repair of FIG. 9 may replace a column line BL of the normal fuse region 312 with a column line RBL of the redundancy fuse region 316.

Figure 10:
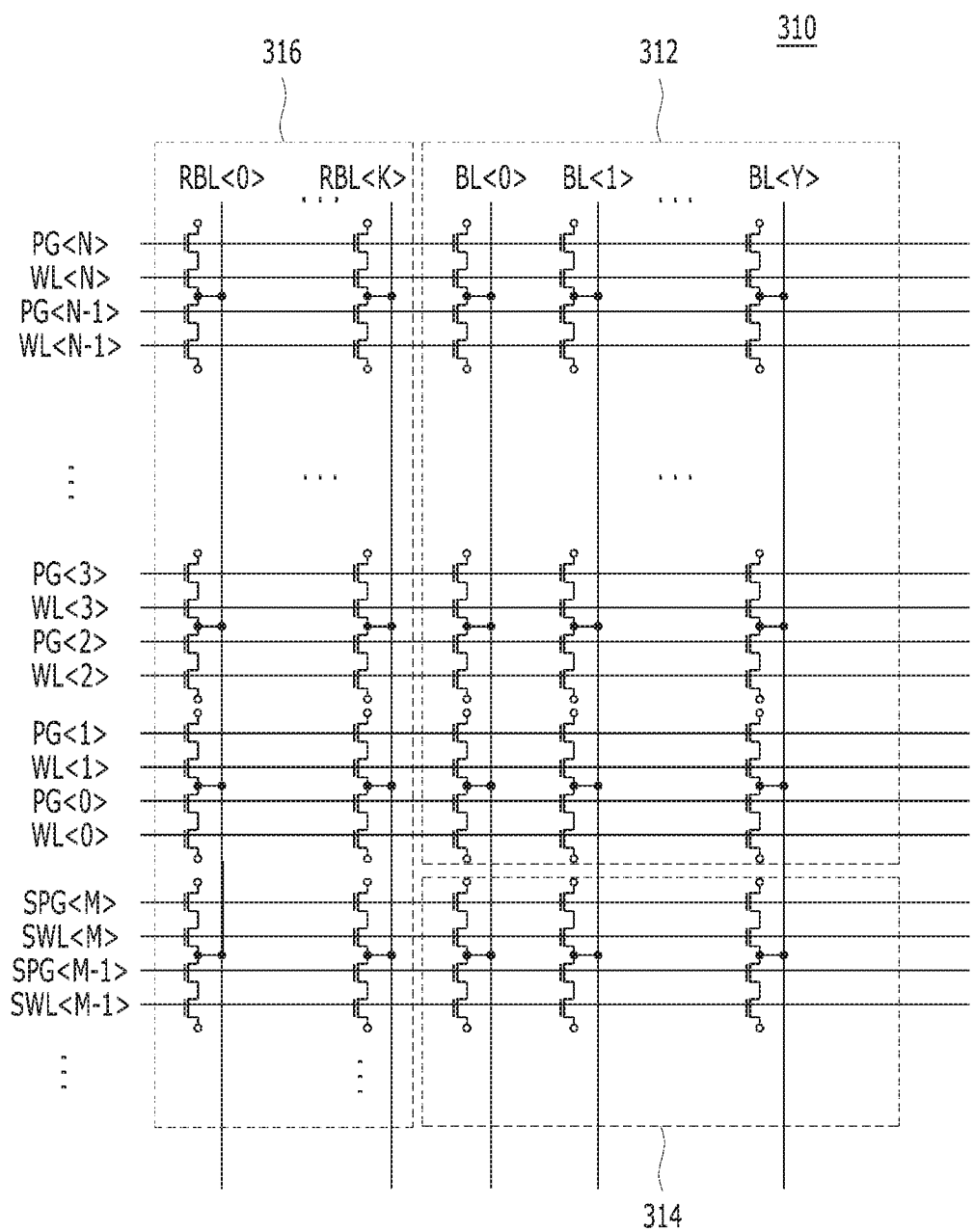
FIG. 10 is a diagram illustrating a coupling of a non-volatile memory and peripheral constituents shown in FIG. 9.

FIG. 10 is a block diagram illustrating a coupling of a non-volatile memory 310 and peripheral constituents shown in FIG. 9.

Referring to FIG. 10, the normal fuse region 312 included in the ARE circuit 310 may be selectively programmed using program voltages PG<0:N>, and the plurality of fuse cells FC coupled to row lines WL<0:N> and column lines BL<0:Y> may be arranged in an array shape in the normal fuse region 312. The self-repair fuse region 314 may be selectively programmed using program voltages SPG<0:M>, and the plurality of fuse cells FC coupled to row lines SWL<0:M> and the column lines BL<0:Y> may be arranged in an array shape in the self-repair fuse region 314. The redundancy fuse region 316 may be selectively programmed using program voltages PG<0:N> and SPG<0:M>, and the plurality of fuse cells FC coupled to the row lines WL<0:N> and SWL<0:M> and column lines RBL<0:K> may be arranged in an array shape in the redundancy fuse region 316. The fuse cells FC of the normal fuse region 312, the self-repair fuse region 314 and the redundancy fuse region 316 may have the same structure, and the redundancy fuse region 316 may have the column lines RBL<0:K> which are distinct from the column lines BL<0:Y> of the normal fuse region 312.

Referring back to FIG. 9, the operation control block 320 and 330 may control an operation of the ARE circuit 310 based on an input address ADD. The operation control block 320 and 330 may control the ARE circuit 310 to read out normal fuse data FZDATA_N of the normal fuse region 312 during the pre-boot-up operation, to program a defective address BLADD stored in the latch block 360 into the self-repair fuse region 314 during the self-rupture operation and to sequentially read out self-fuse data FZDATA_S of the self-repair fuse region 314 and the normal fuse data FZDATA_N of the normal fuse region 312 during the post-boot-up operation but to read out the normal fuse data FZDATA_N by performing a control to select the column lines RBL<0:K> of the redundancy fuse region 316 instead of the column lines BL<0:Y> of the normal fuse data FZDATA_N based on the self-fuse data FZDATA_S.

The error detection block 340 may detect defective fuse cells of the normal fuse region 312 based on the normal fuse data FZDATA_N, which is read out during the pre-boot-up operation, to store the defective address BLADD in the latch block 360. The error detection block 340 may generate an error flag signal FLAG when a defective fuse cell that does not have a predetermined initial value among the fuse cells of the normal fuse region 312 is detected, and the latch block 360 may store the normal fuse data FZDATA_N, which is inputted when the error flag signal FLAG is generated, as the defective address BLADD. The error detection block 340 may output a final flag signal FFLAG according to the generated error flag signal FLAG.

Differently from the latch block 160 shown in FIG. 3, the latch block 360 shown in FIG. 9 may store the normal fuse data FZDATA_N having column information instead of the input address ADD having row information. Accordingly, the semiconductor device of FIG. 9 does not need a comparison block for comparing the defective address BLADD stored in the latch block 360 with the input address ADD. However, as the column control unit 332 receives the defective address BLADD stored in the latch block 360 and generates a redundancy column line selection signal RBL_SEL capable of replacing the column line RBL of the redundancy fuse region 316 instead of a column line selection signal BL_SEL that selects the column line BL of the normal fuse region 312, the defective cells may be repaired.

Hereinafter, an operation of the semiconductor device shown in FIG. 9 will be described with reference to FIGS. 9 to 14.

Figure 11:
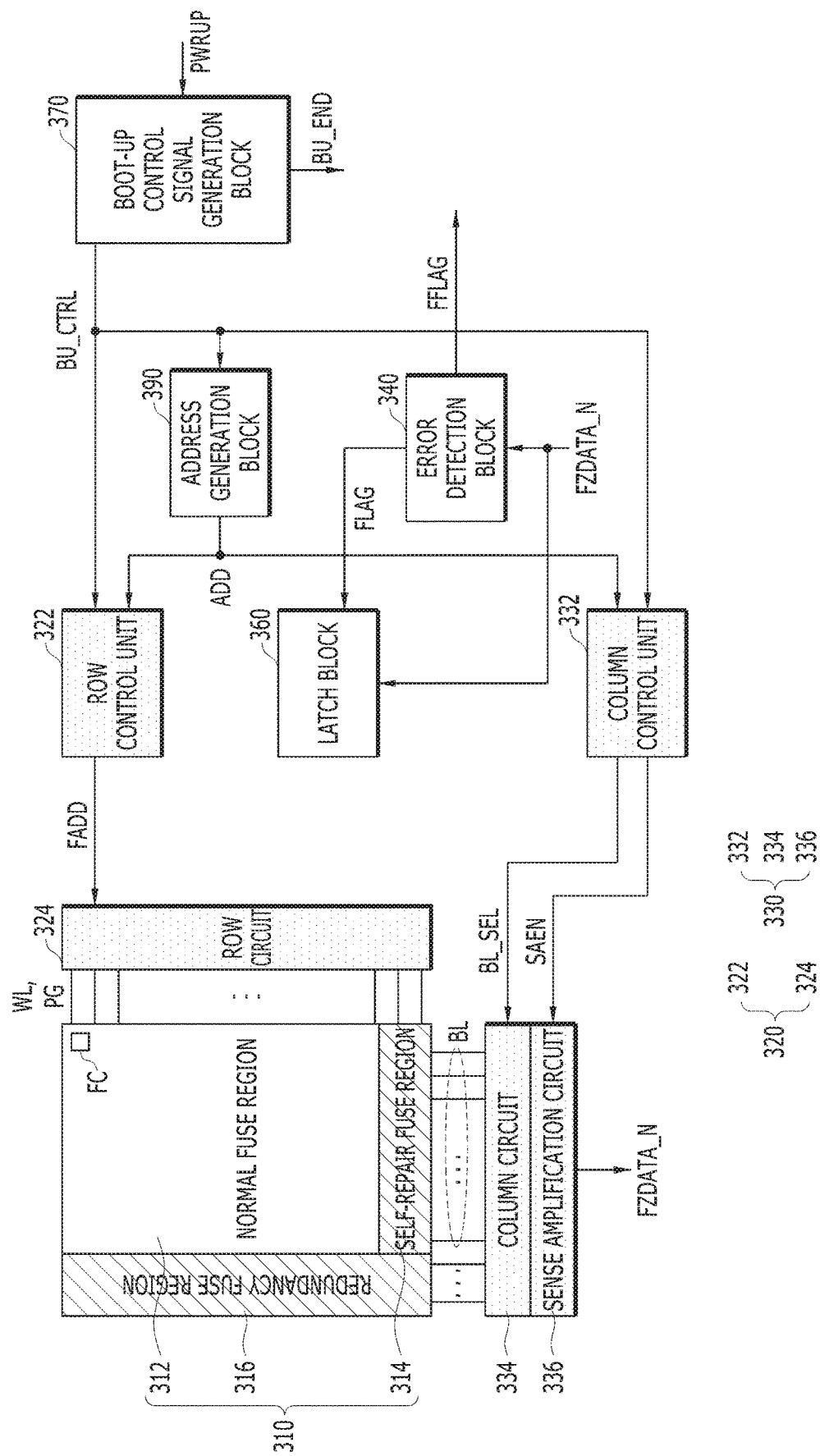
FIG. 11 is a block diagram illustrating a pre-boot-up operation of a semiconductor device shown in FIG. 9.

FIG. 11 is a block diagram illustrating the pre-boot-up operation of the semiconductor device shown in FIG. 9.

Referring to FIG. 11, the boot-up control signal generation block 370 may generate a boot-up control signal BU_CTRL indicating the pre-boot-up operation in response to a power-up signal PWRUP, and hence the address generation block 390 may generate the input address ADD based on the boot-up control signal BU_CTRL.

The row operation control block 320 may generate a fuse address FADD so as to select the row line WL of the normal fuse region 312 corresponding to the input address ADD, and the column operation control block 330 may generate the column line selection signal BL_SEL and a sense amplification enable signal SAEN so that the normal fuse data FZDATA_N is outputted from the plurality of fuse cells coupled to the selected row line WL. Thus, the normal fuse data FZDATA_N of the normal fuse region 312 may be read out.

The error detection block 340 may detect whether or not there are the defective fuse cells among the fuse cells of the normal fuse region 312 based on the normal fuse data FZDATA_N to generate the error flag signal FLAG, and the latch block 360 may store the normal fuse data FZDATA_N, which is inputted when the error flag signal FLAG is generated, as the defective address BLADD. As the normal fuse data FZDATA_N, not the input address ADD, is stored as the defective address BLADD, information on defective column lines of the normal fuse data FZDATA_N may be stored.

Figure 12:
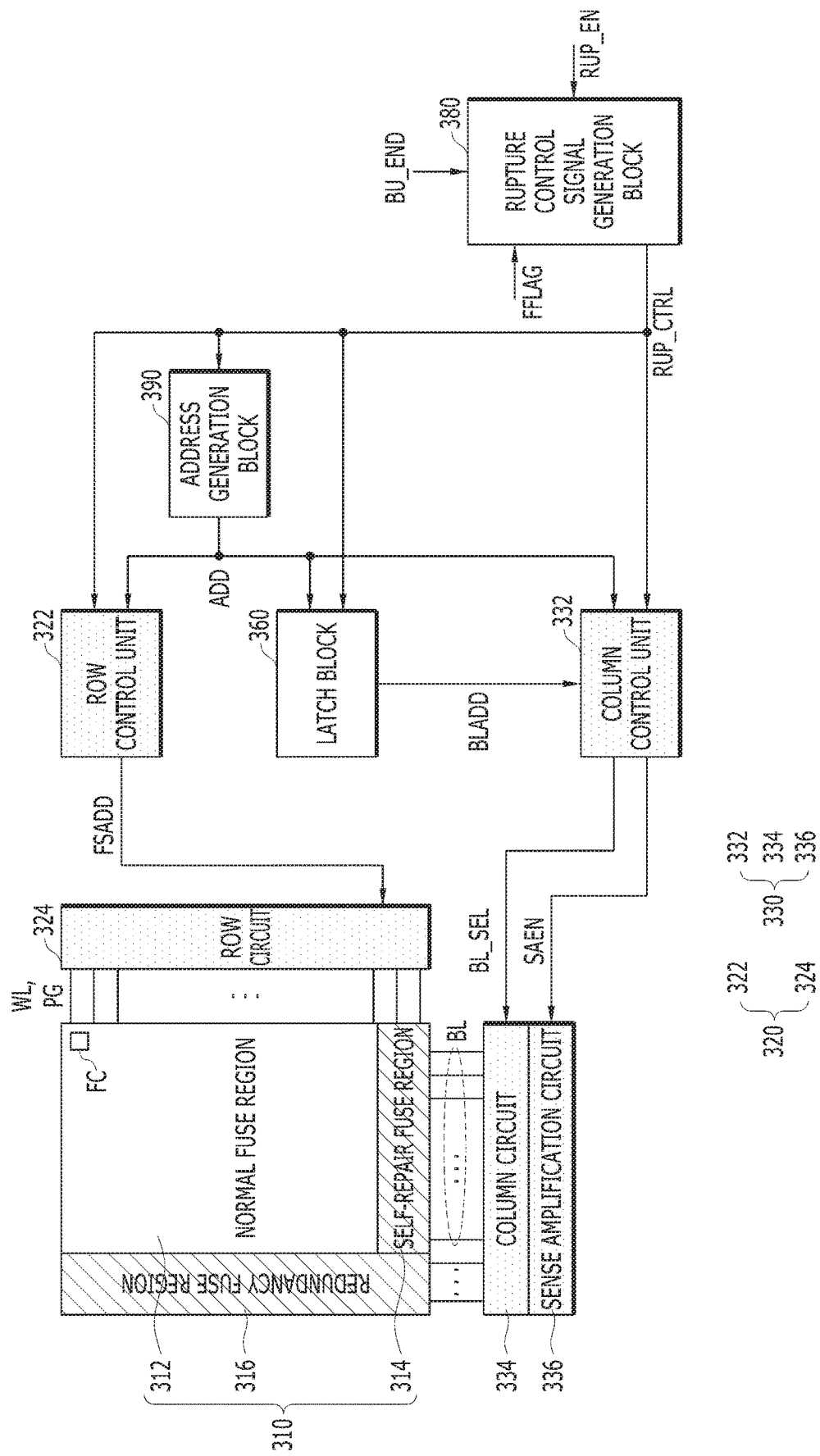
FIG. 12 is a block diagram illustrating a self-rupture operation of a semiconductor device shown in FIG. 9.

FIG. 12 is a block diagram illustrating the self-rupture operation of the semiconductor device shown in FIG. 9.

Hereinafter, it is assumed for the sake of convenience in description, that an eighth column line BL<7> and a $101^{st}$ column line BL<100> of the normal fuse region 312 are detected as defective column lines and the normal fuse data FZDATA_N corresponding to the defective column lines is stored as the defective address BLADD in the latch block 360 during the pre-boot up operation.

Referring to FIG. 12, when the final flag signal FFLAG and a boot-up termination signal BU_END are generated, the rupture control signal generation block 380 may generate a rupture control signal RUP_CTRL indicating the self-rupture operation.

Accordingly, the address generation block 390 may generate the input address ADD corresponding to the self-repair fuse region 314. The latch block 360 may output the defective address BLADD corresponding to the input address ADD based on the rupture control signal RUP_CTRL.

The row operation control block 320 may generate a fuse address FSADD so as to select the row lines SWL<0:M> of the self-repair fuse region 314, and the column operation control block 330 may generate the column line selection signal BL_SEL and the sense amplification enable signal SAEN so that the defective address BLADD stored in the latch block 360 is sequentially programmed into the plurality of fuse cells coupled to the row lines SWL<0:M>. Thus, information corresponding to the eighth column line BL<7> and the $101^{st}$ column line BL<100> of the normal fuse region 312 may be programmed into the row lines SWL<0:1> of the self-repair fuse region 314.

Figure 13:
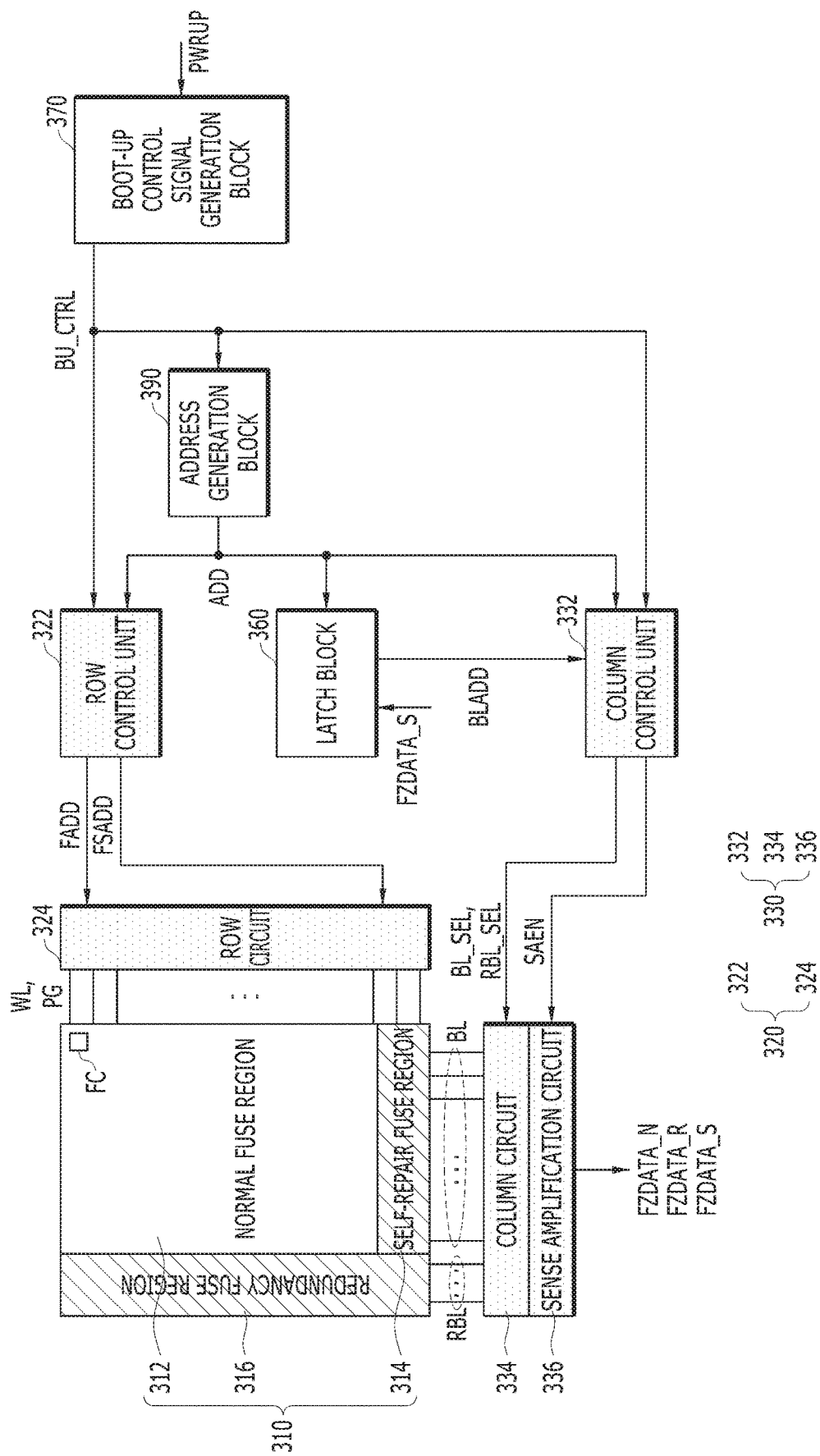
FIG. 13 is a block diagram illustrating a post-boot-up operation of a semiconductor device shown in FIG. 9.

FIG. 13 is a block diagram illustrating the post-boot-up operation of the semiconductor device shown in FIG. 9.

Referring to FIG. 13, the boot-up control signal generation block 370 may generate the boot-up control signal BU_CTRL indicating the post-boot-up operation in response to the power-up signal PWRUP, and hence the address generation block 390 may generate the input address ADD based on the boot-up control signal BU_CTRL.

The row operation control block 320 may generate the fuse address FSADD so as to sequentially select row lines SWL<0:1> of the self-repair fuse region 314, and the column operation control block 330 may read out the self-fuse data FZDATA_S outputted from the selected row lines SWL<0:1>. Accordingly, the self-fuse data FZDATA_S corresponding to the eighth column line BL<7> and the $101^{st}$ column line BL<100> of the normal fuse region 312 may be stored in the latch block 360.

Subsequently, the address generation block 390 may initialize the input address ADD, and the row control unit 322 may generate the fuse address FADD so that the row lines WL<0:N> of the normal fuse region 312 are sequentially selected.

In this case, the latch block 360 may provide the defective address BLADD to the column control unit 332. The column control unit 332 may generate the column line selection signal BL_SEL and the redundancy column line selection signal RBL_SEL so that the eighth column line BL<7> and the $101^{st}$ column line BL<100> of the normal fuse region 312 corresponding to the defective address BLADD are replaced with column lines RBL<0:1> of the redundancy fuse region 316.

Therefore, the semiconductor device may sequentially read out the normal fuse data FZDATA_N of the normal fuse region 312 corresponding to the input address ADD by controlling the column lines RBL<0:1> of the redundancy fuse region 316 to be selected instead of the defective column lines of the normal fuse region 312.

Figure 14:
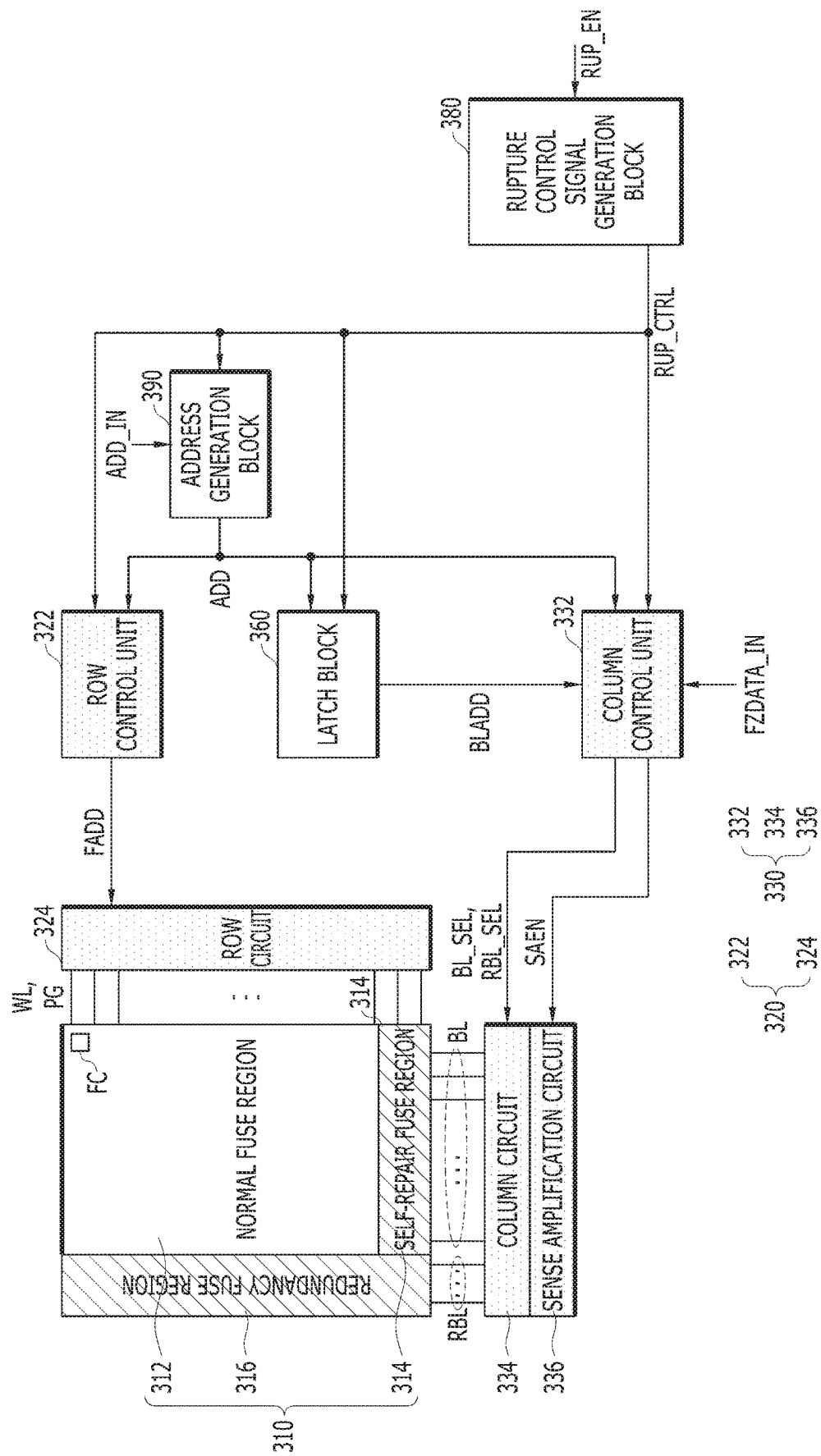
FIG. 14 is a block diagram illustrating a normal rupture operation of a semiconductor device shown in FIG. 9.

FIG. 14 is a block diagram illustrating the normal rupture operation of the semiconductor device shown in FIG. 9.

Referring to FIG. 14, the rupture control signal generation block 380 may generate the rupture control signal RUP_CTRL indicating the normal rupture operation in response to a rupture enable signal RUP_EN inputted from an external device.

Since the normal rupture operation is performed after the post-boot-up operation, which is described above with reference to FIG. 13, is performed, the self-fuse data FZDATA_S corresponding to the eighth column line BL<7> and the $101^{st}$ column line BL<100> of the normal fuse region 312 may be already stored in the latch block 360.

The address generation block 390 may generate the input address ADD corresponding to a target address ADD_IN inputted from the external device based on the rupture control signal RUP_CTRL.

The row control unit 322 may generate the fuse address FADD so that the row lines WL<0:N> of the normal fuse region 312 are sequentially selected.

In this case, the latch block 360 may provide the defective address BLADD to the column control unit 332. The column control unit 332 may generate the column line selection signal BL_SEL and the redundancy column line selection signal RBL_SEL so that the eighth column line BL<7> and the $101^{st}$ column line BL<100> of the normal fuse region 312 corresponding to the defective address BLADD are replaced with column lines RBL<0:1> of the redundancy fuse region 316.

Therefore, the semiconductor device may sequentially program the target address ADD_IN into the normal fuse region 312 corresponding to the input address ADD by controlling the column lines RBL<0:1> of the redundancy fuse region 316 to be selected instead of the defective column lines of the normal fuse region 312.

In accordance with the embodiments of the present invention described as above, a non-volatile memory includes redundancy fuse cells for repairing defective fuse cells, and when the defective fuse cells are detected during the boot-up operation, the defective fuse cells are replaced with the redundancy fuse cells, whereby the yield of a semiconductor device may be improved.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

Also, dispositions and types of the logic gates and transistors described in the aforementioned embodiments may be implemented differently based on the polarity of the inputted signal.

What is claimed is:

1. A semiconductor device comprising:
    a non-volatile memory including a normal region, a self-repair region and a redundancy region, each having a plurality of cells;
    a first boot-up control block suitable for controlling a first boot-up operation to detect defective cells of the normal region and store a defective address in a first latch unit;
    a self-program control block suitable for controlling a self-program operation to program the defective address stored in the first latch unit into the self-repair region; and
    a second boot-up control block suitable for controlling a second boot-up operation to read out data of the normal region based on an input address while reading out data of the redundancy region instead of the data of the normal region when data of the self-repair region coincides with the input address.

2. The semiconductor device of claim 1, wherein the first boot-up operation is performed in an initial state where the non-volatile memory is not programmed, and the second boot-up operation is performed after the non-volatile memory is programmed.

3. The semiconductor device of claim 1, wherein the self-program operation is performed when the defective cells of the normal region are detected during the first boot-up operation, regardless of whether or not an external command is inputted.

4. The semiconductor device of claim 1, wherein the first boot-up control block includes:
    an error detection unit suitable for generating an error flag signal when a cell which does not have a predetermined initial value among the cells of the normal region is detected; and
    the first latch unit suitable for storing the input address, which is inputted when the error flag signal is generated, as the defective address.

5. The semiconductor device of claim 4, wherein the self-program operation is performed in response to the error flag signal and a boot-up termination signal indicating completion of the first boot-up operation.

6. The semiconductor device of claim 4, wherein the second boot-up control block includes:
    a second latch unit suitable for sequentially storing the data of the self-repair region;
    a comparison unit suitable for comparing data stored in the second latch unit with the input address and activating a redundancy enable signal when the data stored in the second latch unit coincides with the input address as a result of the comparison; and
    a first path control unit suitable for sequentially reading out the data of the normal region while outputting the data of the redundancy region instead of the data of the normal region when the redundancy enable signal is generated.

7. The semiconductor device of claim 6, wherein the first and second latch units are composed of the same latch circuit.

8. The semiconductor device of claim 1, further comprising:
    a memory array region including a normal cell region and a redundancy cell region for repairing defective cells of the normal cell region; and
    a lath circuit suitable for storing the data outputted from the normal region or the redundancy region during the second boot-up operation,
    wherein the normal region of the non-volatile memory corresponds one-to-one with the redundancy cell region of the memory array region.

9. The semiconductor device of claim 8,
wherein the normal region permanently stores defective addresses of the defective cells of the normal cell region,
wherein the self-repair region permanently stores the defective addresses of the defective cells of the normal region, and
wherein the redundancy region is provided for repairing the defective cells of the normal region and permanently stores the defective addresses of the defective cells of the normal cell region instead of the defective cells of the normal region.

10. The semiconductor device of claim 1, further comprising: a normal program control block suitable for controlling a normal program operation to program target data into the normal region corresponding to the input address based on a program enable signal while programming the target data into the cell of the redundancy region instead of the cell of the normal region when the data of the self-repair region coincides with the input address.

* * * * *